(12) United States Patent
Nazar et al.

(10) Patent No.: US 12,061,233 B2
(45) Date of Patent: Aug. 13, 2024

(54) METHOD AND CIRCUIT FOR PERFORMING ERROR DETECTION ON A CLOCK GATED REGISTER SIGNAL

(71) Applicant: Imagination Technologies Limited, Kings Langley (GB)

(72) Inventors: Faizan Nazar, Hertfordshire (GB); Kenneth Rovers, Hertfordshire (GB)

(73) Assignee: Imagination Technologies Limited, Kings Langley (GB)

( * ) Notice: Subject to any disclaimer, the term of this patent is extended or adjusted under 35 U.S.C. 154(b) by 0 days.

(21) Appl. No.: 18/193,509

(22) Filed: Mar. 30, 2023

(65) Prior Publication Data

US 2023/0384375 A1 Nov. 30, 2023

(30) Foreign Application Priority Data

Mar. 31, 2022 (GB) .................................... 2204690
Mar. 31, 2022 (GB) .................................... 2204692

(51) Int. Cl.
  *G01R 31/317* (2006.01)
(52) U.S. Cl.
  CPC .............................. *G01R 31/31727* (2013.01)
(58) Field of Classification Search
  CPC .................. G01R 31/31727; G06F 11/1004
  See application file for complete search history.

(56) References Cited

U.S. PATENT DOCUMENTS

| | | |
|---|---|---|
| 6,701,484 B1 | 3/2004 | Jordan et al. |
| 8,365,049 B2 | 1/2013 | Pribbernow et al. |
| 2007/0234182 A1* | 10/2007 | Wickeraad ............... G11C 5/04 714/763 |
| 2023/0384374 A1* | 11/2023 | Nazar .............. G01R 31/31727 |

* cited by examiner

*Primary Examiner* — Thien Nguyen
(74) *Attorney, Agent, or Firm* — Potomac Law Group, PLLC; Vincent M DeLuca

(57) ABSTRACT

An error detection circuit and method for performing cyclic redundancy check on a clock gated register signal is disclosed. The error detection circuit comprise a first register, a second register, a third register and an error detection module. The first register is a clock gated register and is configured to be updated with a data signal (x) in response to a clock enabling signal. The second register is configured to be updated with a check bit (c) based on the data signal (x). The check bit is calculated by a check bit calculation unit. The third register is configured to be updated with a current value (b) of the clock enabling signal. The error detection module is configured for calculating an indication bit (I) based on at least the output of the first register, the output of the second register and the output of the third register.

20 Claims, 12 Drawing Sheets

METHOD AND CIRCUIT FOR PERFORMING ERROR DETECTION ON A CLOCK GATED REGISTER SIGNAL

CLAIM OF PRIORITY

This application claims foreign priority under 35 U.S.C. 119 from United Kingdom patent application Nos. 2204690.8 and 2204692.4, each filed on 31 Mar. 2022, and which are herein incorporated by reference in their entirety.

BACKGROUND

In the modern digital world, all sorts of data transfer and computing are digital in nature. Various electronic and electrical systems such as telecommunication systems or computing systems use processors such as central processing units (CPUs) and graphics processing units (GPUs) all of which handle the data as numbers in binary format such as fixed-point format or floating-point format. The data is transmitted from one device to another, or from one module to another within a device either through wires or wirelessly. The transmitted data is prone to errors due to many factors affecting it such as noise.

One of the errors that can occur in digital data is the corruption of a bit(s), i.e. a 1 bit flipping to 0 or a 0 bit flipping to 1 during transmission. These errors are more critical when it comes to the functioning of safety-critical systems/devices such as automobiles, medical equipment etc. Hence safety-critical devices need to comply with safety-critical standards to ensure safety against errors or hardware failure such as systematic failures or random failures. A random hardware failure can occur because of aging of the silicon or electronics causing a short circuit, for example, and these are referred to as permanent failures. Alternatively, a random hardware failure can occur due to natural radiation present in our world and the immediate environment of the device, such failures are called Soft Errors and are referred to as transient failures. As mentioned all these hardware failures can cause errors or corruption of data.

There are many different ways of detecting errors or corruption of data in electronic and electrical systems/devices. However, they are all not suitable in all situations.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

An error detection circuit and method for performing cyclic redundancy check on a clock gated register signal is disclosed. The error detection circuit comprise a first register, a second register, a third register and an error detection module. The first register is a clock gated register and is configured to be updated with a data signal (x) in response to a clock enabling signal. The second register is configured to be updated with a check bit (c) based on the data signal (x). The check bit is calculated by a check bit calculation unit. The third register is configured to be updated with a current value (b) of the clock enabling signal. The error detection module is configured for calculating an indication bit I based on at least the output of the first register, the output of the second register and the output of the third register.

According to a first aspect there is provided an error detection circuit for performing cyclic redundancy check on a clock gated register signal, the error detection circuit comprising: a first register, a second register, a third register and an error detection module. The first register is a clock gated register and is configured to be updated with a data signal (x) in response to a clock enabling signal. The second register is configured to be updated with a check bit (c) based on the data signal (x). The check bit is calculated by a check bit calculation unit. The third register is configured to be updated with a current value (b) of the clock enabling signal. The error detection module is configured for calculating an indication bit I based on at least the output of the first register, the output of the second register and the output of the third register.

Optionally, the check bit calculation unit is configured to calculate the check bit by performing XOR reduction operation or nXOR reduction operation of the n bits of the data signal (x).

Optionally, the check bit calculation unit is configured to calculate the check bit by nXOR reducing or XNOR reducing the n bits of the data signal (x).

Optionally, the check bit is an even parity bit or an odd parity bit.

Optionally, the first register is configured to be updated with a data signal (x) every time when the first register is enabled in response to the clock enabling signal.

Optionally, the second register is configured to be updated with a check bit (c) irrespective of the clock enabling signal.

Optionally, the third register is not a clock gated register and is configured to be updated with a 1 bit when the clock enabling signal is high and with a 0 bit when the clock enabling signal is low.

Optionally, the error detection module is configured to detect an error in updating the first register based on a valid signal stored in a fourth register.

Optionally, the error detection module is configured to detect an error in updating the first register when the indication bit is a high value.

Optionally, third register is configured to store the value of the current clock enabling signal and to provide the output to the error detection circuit thereby eliminating consecutive false positive failures.

According to a second aspect, there is a provided a method of performing cyclic redundancy check on a clock gated register signal, the method comprising: updating a first register with a data signal (x) in response to a clock enabling signal; updating a second register with a check bit (c) corresponding to the data signal (x), wherein the check bit is calculated by a check bit calculation unit; updating a third register with a current value (b) of the clock enabling signal; and calculating an indication bit I based on an output received from the updated first register, second register and the third register.

Optionally, calculating the check bit is performed by XOR reducing the bits of the data signal (x), where the data signal x is having a bit width of 'n' bits.

Optionally, calculating the check bit is performed by nXOR reducing the bits of the data signal (x) where the data signal x is having a bit width of 'n' bits.

Optionally, updating the first register comprises updating with the data signal (x) when the first register is enabled in response to the clock enabling signal.

Optionally, updating the second register comprises updating with the calculated check bit irrespective of whether the clock enabling signal is a high or a low.

Optionally, updating the third register is performed irrespective of whether the clock enabling signal is a high or a low.

Optionally, the calculation of the indication bit comprises performing calculation based on a valid signal stored in a fourth register.

Optionally, the calculation of the indication bit comprises producing a value only when the output of the third register indicates that the first register and the second register is updated.

Optionally, the error is detected when the indication bit is a high value.

Optionally, calculating the indication bit based on the current value of clock enabling signal eliminates consecutive false positive failures in consecutive clock cycles.

The error detection circuit may be embodied in hardware on an integrated circuit. There may be provided a method of manufacturing, at an integrated circuit manufacturing system, an error detection circuit. There may be provided an integrated circuit definition dataset that, when processed in an integrated circuit manufacturing system, configures the system to manufacture an error detection circuit. There may be provided a non-transitory computer readable storage medium having stored thereon a computer readable description of an error detection circuit that, when processed in an integrated circuit manufacturing system, causes the integrated circuit manufacturing system to manufacture an integrated circuit embodying an error detection circuit.

There may be provided an integrated circuit manufacturing system comprising: a non-transitory computer readable storage medium having stored thereon a computer readable description of the error detection circuit; a layout processing system configured to process the computer readable description so as to generate a circuit layout description of an integrated circuit embodying the error detection circuit; and an integrated circuit generation system configured to manufacture the error detection circuit according to the circuit layout description.

There may be provided computer program code for performing any of the methods described herein. There may be provided non-transitory computer readable storage medium having stored thereon computer readable instructions that, when executed at a computer system, cause the computer system to perform any of the methods described herein.

The above features may be combined as appropriate, as would be apparent to a skilled person, and may be combined with any of the aspects of the examples described herein.

BRIEF DESCRIPTION OF THE DRAWINGS

Examples will now be described in detail with reference to the accompanying drawings in which.

Figure 1A:
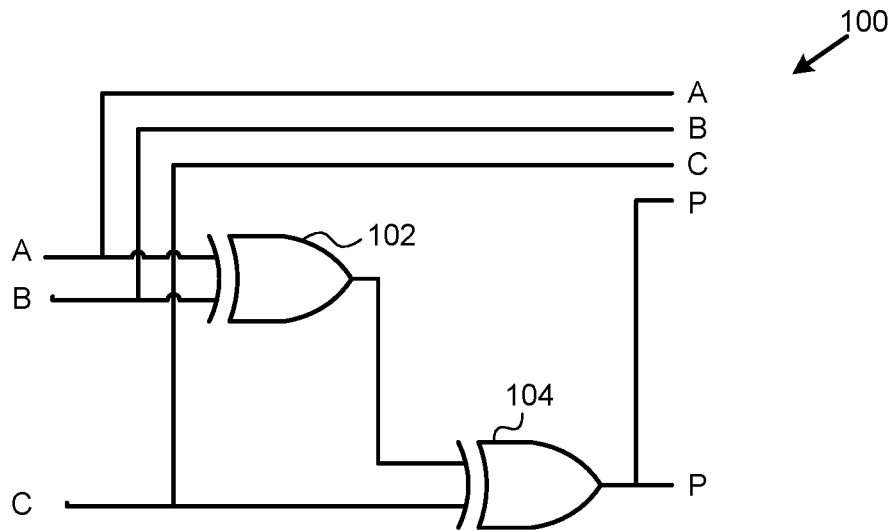
FIG. 1A is a block diagram of an example of a parity generator circuit.

The accompanying drawings illustrate various examples. The skilled person will appreciate that the illustrated element boundaries (e.g., boxes, groups of boxes, or other shapes) in the drawings represent one example of the boundaries. It may be that in some examples, one element may be designed as multiple elements or that multiple elements may be designed as one element. Common reference numerals are used throughout the figures, where appropriate, to indicate similar features.

DETAILED DESCRIPTION

The following description is presented by way of example to enable a person skilled in the art to make and use the invention. The present invention is not limited to the embodiments described herein and various modifications to the disclosed embodiments will be apparent to those skilled in the art.

Embodiments will now be described by way of example only.

As mentioned earlier, there are various error detection techniques for checking the correctness of data in hardware. In digital devices, the data is represented as binary numbers in floating-point format or fixed number format. Checking the correctness of various components of the hardware device is critical in many scenarios such as to identify and eliminate errors in devices that need to be functionally safe. For example, in hardware devices such as neural network accelerators, GPU's etc. it is important to detect any error in updating the registers holding safety-critical information. If not, these errors that are captured will propagate through the system. There are several known ways of detecting an error in a register update such as parity check or cyclic redundancy check.

One of the most widely used techniques for error detection of data is known as a parity check technique. The parity check technique uses a parity generator circuit and a parity checker circuit. The parity generator circuit is a combinational logic circuit that generates a parity bit which indicates whether we should expect an even or odd number of high bits (i.e. 1 bits) in the data. The parity checker circuit on the other hand is a circuit that checks the data bits and parity bit to detect if there is an error in the data received. A combination of the parity generator circuit and the parity checker circuit is used in digital circuits to identify or detect an error in the data received by various modules. The parity generation technique is generally used for identifying errors occurring due to a single bit flip in the data which is explained in detail below. In order to reliably identify errors caused due to multiple bit flips in the data a technique called Cyclic Redundancy Checks (CRC) may be used.

A parity check technique can be broadly sub-categorized as an even parity check or an odd parity check. The categorisation is based on whether we should expect an even or odd number of high bits in the data. A parity bit is an additional bit added to the data in order to make the number of 1s either even or odd. When using the even parity check technique, the parity generator circuit generates a parity bit that will make the total number of 1s in the data an even number. Similarly, when using the odd parity check technique, the parity generator circuit generates a parity bit that will make the total number of 1s in the data an odd number. In either case, if the checked data doesn't have the expected number of ones (i.e. an even number or an odd number, depending on the technique being employed), then it is known that an error has occurred. Such parity bit generation, and subsequent error detecting, can be implemented by using Exclusive-OR (XOR) gates. XOR gates combining a series of bits produce zero output when there is an even number of 1s in the series of bits, and a one output when there is an odd number of 1s in the series of bits. To produce a two bit combination, one XOR gate is sufficient, whereas for adding three bits two XOR gates are required as shown in FIG. 1A. FIG. 1A is a block diagram of an example of parity generator circuit 100 used in an even parity check technique. Consider the three inputs A, B and C are provided to the even parity generator to obtain a parity bit P. The parity generator circuit 100 for adding three bits comprises two XOR gates. The XOR operation produces an output '1' if the inputs provided to a logic gate are different and an output '0' if the inputs provided to the logic gate are the same. The first XOR gate 102 performs an XOR operation between the first two inputs A and B. The second XOR gate 104 performs an XOR operation between the output of the first XOR gate and the third input C to generate a parity bit P. The parity bit generated for different combinations of inputs are provided in the table below:

| A | B | C | P |
|---|---|---|---|
| 0 | 0 | 0 | 0 |
| 0 | 0 | 1 | 1 |
| 0 | 1 | 0 | 1 |
| 0 | 1 | 1 | 0 |
| 1 | 0 | 0 | 1 |
| 1 | 0 | 1 | 0 |
| 1 | 1 | 0 | 0 |
| 1 | 1 | 1 | 1 |

In general, for a data having n bits, an operation known as XOR reduction of the n bits can be performed to obtain the (even parity check) parity bit. To introduce this, we can first define an XOR operation operating on inputs a and b as:

$$XOR(\text{exclusive } OR)\text{operation} = a \, XOR \, b, 1 \text{ if } a!=b, 0 \text{ otherwise.}$$

For n bit data x, it can be defined that $x=(x_{n-1}, \ldots x_1, x_0)$, where $x_0$ is the least significant bit, $x1$ the next more significant bit, and so on up until the most significant bit $xn1$. In that case, a bitwise XOR reduction operation on x can be defined as $$XOR\_\text{reduce}(x) = x_{n-1} XOR \ldots x_1 XOR x_0$$

As a result, the parity bit P for an even parity check technique can be obtained as $$P = XOR\_\text{reduce}(x)$$

Whether data contains an error may be checked, based on the generated parity bit, using a parity checker circuit. The parity checker circuit can be an even parity checker or odd parity checker based on the implementation. The actual data along with the generated parity bit is provided to the parity checker circuit for generating an indication bit. The indication bit can be used to infer if the parity check is failed and thus if there is an error in the input data. At this point, it is worth repeating, for clarity, that passing the parity check does not definitively mean that no error is present (as a parity check cannot identify the presence of all sorts of errors), but failing a parity check does indicate that at least one bit flip (specifically, one or any other odd number of separate bit flips) has occurred.

Figure 2A:
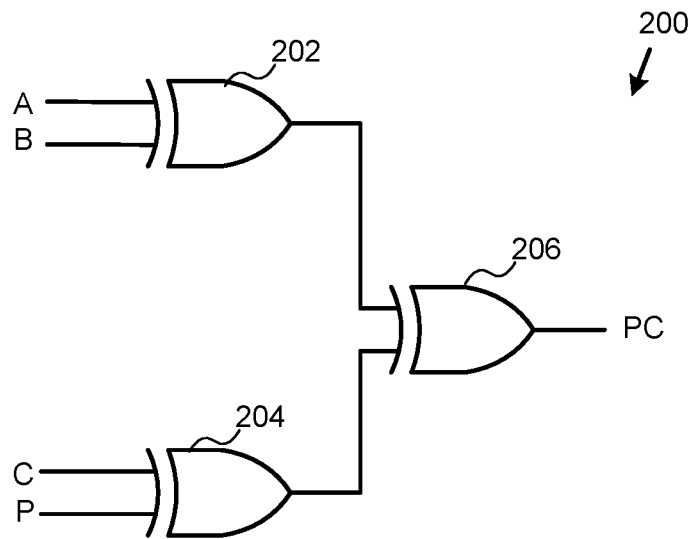
FIG. 2A is a block diagram of an example of a parity checker circuit.

FIG. 2A is a block diagram of an example of a parity checker circuit used in an even parity check technique. Consider the four-bit inputs A, B, C and P from the even parity generator 100 are provided to the parity checker circuit 200. The parity checker circuit 200 checks if the 4 bits received have an even number of 1's. If an error consisting of an odd number of bit flips occurs, then the 4 bits received would comprise an odd number of 1's. The parity checker circuit 200 generates an output based on the number of 1's in the received input. In this arrangement, the parity checker circuit 200 produces an output '1' if there is an error in the received input and produces an output '0' when there is no error in the received input.

The logic expression for checking 4 bits can be implemented using three XOR gates, and it may be recognised that this constitutes an XOR reduction operation. In the example of FIG. 2A, the first XOR gate 202 performs XOR operation between the first two inputs A and B. The second XOR gate 204 performs XOR operation between the second two inputs C and P. The third XOR gate 206 performs XOR operation between the output of the first XOR gate and the second XOR gate to generate a parity_check_output (PC) indicating if there is an error in the received input. It is noted that it is a property of XOR reduction that the order of combination does not affect the result (e.g. inputs A and P could be combined by one XOR operation, whilst inputs C and P are combined by another in parallel, before the outputs of those two XOR operations are subsequently combined to give the overall output). As a consequence, it is further noted that in other examples the three XOR gates may be arranged more sequentially—e.g. with the result of an XOR operation between inputs A and B provided as an input to an XOR operation with input C, and the result of that XOR operation provided as an input to a third XOR operation with the remaining input P. These arrangements achieve the same result, but the illustrated arrangement achieves that result in the fewest gate delays (i.e. two time steps rather than three). The parity_check_output (PC) for a few different combinations of inputs are provided in the table below:

| A | B | C | P | Parity checker output (indication bit) |
|---|---|---|---|---|
| 0 | 1 | 0 | 1 | 0 |
| 0 | 1 | 1 | 0 | 0 |
| 0 | 1 | 1 | 1 | 1 |
| 1 | 0 | 0 | 0 | 1 |
| 1 | 0 | 0 | 1 | 0 |

In general, for original data having n bits and an accompanying parity check bit P, an XOR reduction of the n bits with the parity check bit P can be performed to obtain the parity check output bit. This is equivalent to performing an XOR reduction operation on the n bits of the original data and the parity check bit P.

For n bit data $x=(x_{n-1}, \ldots, x_0)$, parity_check_output (PC) can be obtained as $$PC = XOR\_reduce(x) XOR\ P$$

An error is detected when the value of PC=1.

For a number of signals, j, a collective parity check output is obtained as:

$$\text{Collective parity check output} = OR\_reduce(PC0, PC1, \ldots PCj-1)$$

In the preceding equation, 'OR_reduce( )' represents an OR reduction operation and different individual parity check values PC are represented by different subscripts.

Figure 1B:
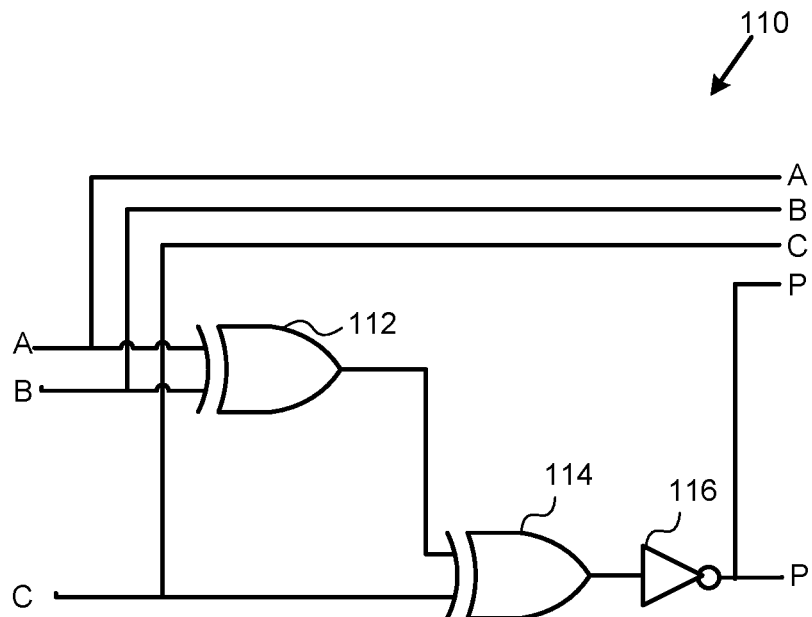
FIG. 1B is a block diagram of an example of another parity generator circuit.

FIG. 1B is a block diagram of an example of a parity generator circuit 110 used in an odd parity check technique. Consider the three inputs A, B and C are provided to the even parity generator to obtain a parity bit P. The parity generator circuit 110 for adding three bits comprises two XOR gates 112 and 114 and a NOT gate 116. The first XOR gate 112 performs an XOR operation between the first two inputs A and B. The second XOR gate 114 performs an XOR operation between the output of the first XOR gate and the third input C. The output of the second XOR gate is fed through the NOT gate to generate a parity bit P. The parity bit generated for different combinations of inputs are provided in the table below:

| A | B | C | P |
|---|---|---|---|
| 0 | 0 | 0 | 1 |
| 0 | 0 | 1 | 0 |
| 0 | 1 | 0 | 0 |
| 0 | 1 | 1 | 1 |
| 1 | 0 | 0 | 0 |
| 1 | 0 | 1 | 1 |
| 1 | 1 | 0 | 1 |
| 1 | 1 | 1 | 0 |

Thus, for the parity generated circuit implemented as shown in FIG. 1B, the parity bit P is obtained as:

$$P = NOT((A\ XOR\ B) XOR\ C)$$

Thus, the parity bit P can be obtained performing XOR reducing operations followed by a NOT operation (known as nXOR reduce operation or more commonly known as XNOR reduction operation). In general, for a data having n bits, an operation known as nXOR reduction of the n bits can be performed to obtain the (odd parity check) parity bit.

As a result, for n bit data $x=(x_{n-1}, \ldots, x_0)$, the parity bit P for an odd parity check technique can be obtained as $$P = nXOR\_reduce(x) = NOT\ (x_{n-1} XOR\ \ldots\ XOR\ x_0)$$
$$= x_{n-1}\ XNOR\ x_{n-2}\ \ldots\ XNOR\ x_0$$

The error in the data may be checked using a parity checker circuit as discussed earlier.

Figure 2B:
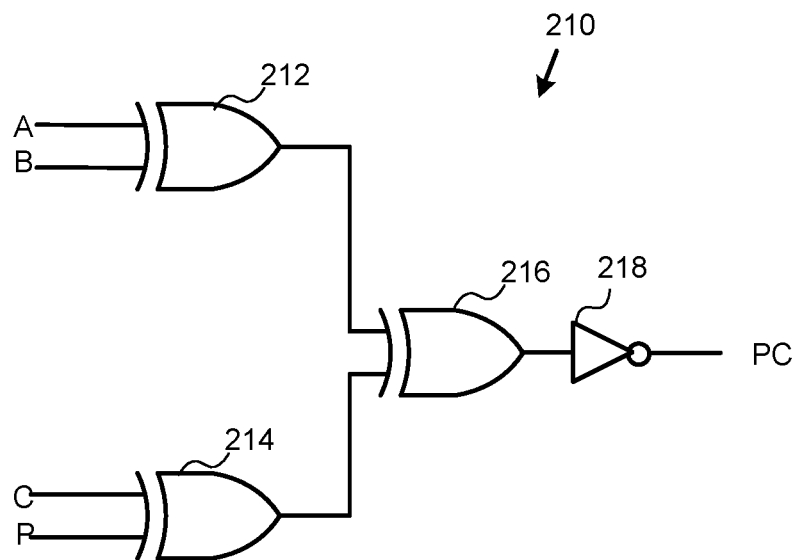
FIG. 2B is a block diagram of an example of another parity checker circuit.

FIG. 2B is a block diagram of an example of a parity checker circuit 210 in an odd parity check technique. Consider the four-bit inputs A, B, C and P from the parity generator circuit 110 are provided to the parity checker circuit 210. The parity checker circuit 210 checks if the 4 bits received have an odd number of 1's. The parity checker circuit 210 generates an output based on the number of 1's in the received input. The parity checker circuit 210 produces an output '1' if there is an error in the received input and produces an output '0' when there is no error in the received input.

The logic expression for checking 4 bits can be implemented using three XOR gates and a NOT gate. The first XOR gate 212 performs XOR operation between the first two inputs A and B. The second XOR gate 214 performs XOR operation between the second two inputs C and P. The third XOR gate 216 performs XOR operation between the output of the first XOR gate and the second XOR gate. The output of the third XOR gate is fed through the NOT gate 218 to generate a parity_check_output (PC) indicating if there is an error in the received input. The parity_check_output (PC) for a few different combinations of inputs are provided in the table below:

| A | B | C | P | Parity checker output |
|---|---|---|---|---|
| 0 | 0 | 0 | 0 | 1 |
| 0 | 0 | 0 | 1 | 0 |
| 0 | 0 | 1 | 0 | 0 |
| 0 | 0 | 1 | 1 | 1 |
| 0 | 1 | 0 | 0 | 0 |

For n bit data $x=(x_{n-1}, \ldots, x_0)$, parity_check_output (PC) is obtained as $$PC = NOT(XOR\_reduce(x) XOR\ P)$$

For a number of signals, collective parity_check_output is obtained as:

$$\text{Collective parity check output} = OR\_reduce(PC),$$

The data signal (x) may be a represented in binary number having a bitlength of n bits. The data signal may be provided to the circuit for parity check as having a bit-length of n bits. In some other examples the data signal (x) or may be split into different portions each having a bit length of m bits, where m<n, and each portion would be provided as an input to the circuit. The smaller the bit-length of the portion, the more specific and accurate would be the identification of the error in receiving the data signal. For example, consider a 16 bit data signal split into two portions of 8 bits long. If there is a bit flip in both the portions, the error detection circuit would be able to identify the error in both the portions. However, if both the portions were provided to the error detection circuit such that there are two bits flipped in the input data signal, the error detection circuit may not be able to identify the error. To identify the error in both the portions, either two circuits need to be implemented or the sequence should be fed in series. Thus the parity check can be implemented in any granularity where the granularity of the circuit is equal to the size of the block x.

As discussed earlier, checking the correct operation of a hardware device is critical in functionally safe devices. In order to check the correctness of various modules such as a register in the hardware device, cyclic redundancy checks may be performed, and parity generator and parity checker circuits can be implemented for the register that needs to be checked. This can be called a register parity check. A register parity check implements a parity generator circuit to generate a parity bit for the inputs received at a register and a parity checker circuit to detect a parity error in data retrieved from the register based on the parity bit generated.

The circuit for performing a register parity check may comprise a register for holding the input data signal and a parity generation circuit for generating a parity bit corresponding to the data signal. Further, the circuit may comprise a parity checker circuit receiving the input data signal and the calculated parity bit for detecting an error.

The addition of the combination of logic for a parity generator circuit and a parity checker circuit can cause a significant impact on the design architecture of the hardware. One of the major impacts is the fact that the addition of these logics can increase the length of the critical path (i.e. can increase the delay in generating an output due to the increase in the number of components in the path). In other words, the parity generation unit may take some time to calculate the parity bit corresponding to the received input signal before providing it to the parity checker circuit compared to providing the data signal stored in the register. If not accounted for, this could lead to incorrect error detection as the parity checker circuit may receive input data but not the parity bit corresponding to the input data at the same time. These kinds of error are more likely to occur especially where a register for storing a data signal is a clock gated register, i.e. where the registers are updated only when the register is enabled using a clock enabling signal. With clock gated registers, the addition of these extra logics to an existing design could be critical in determining if the modified design still meets the required timings specifically the clock frequencies. Even if the modified design meets the required timing, the tighter critical path will cause increased area and/or power to meet that timing.

Clock gated registers comprise an internal clock gating circuitry integrated into the register design. The clock gating circuitry/logic can be added into a design in one of many ways. The clock gating logic can be coded into register transfer level (RTL) code or inserted into the design manually by the designers to gate clocks to specific registers or can be semi-automatically inserted into the RTL by automated clock gating tools. The clock gating circuitry is used with registers for reducing power consumption by removing the clock signal or disabling the register when it is not in use or needed. However, the addition of extra logic for clock gating into each register further adds to the critical path of the circuits.

Consider that the internal clock gating circuitry of the clock gated registers is designed using a logic circuit. The internal clock gating circuitry may receive a clock signal (clk) and a clock enabling signal as inputs. The enabling signal controls or gates the clock signal to provide/generate a gated clock signal to the clock gated register which in-turn activates or deactivates the clock gated register. That is, in one example, the clock gated register may be designed to be activated (or "enabled", so that the content of the register may be updated) when the clock enabling signal is high and deactivated (or "disabled", so that the content of the register may not be updated) when the clock enabling signal is low. In other examples this may be implemented in the opposite condition such that the clock gated register is activated when the clock enabling signal, typically called a 'clock gating signal' in such configurations, is low and is deactivated when the clock gating signal is high. The enabling/gating signal provided to the clock gated register for enabling/disabling the clock gated register may be high or low depending on the design of the internal clock gating circuitry or the way it is coded in the RTL.

Thus, just implementing the known parity circuits are not suitable for checking the correctness of the clock gated registers. Suppose a normal parity circuit, say a parity generator is used with a clock gated register to generate the parity bit for the received data signal. The parity generator may generate a parity bit for the received data signal as discussed earlier, but the clock gated register may or may not be updated with the received data signal depending on the clock enabling signal. Hence when input from the register and the parity generator is provided to a parity check, the check may not be performed correctly as the register may not be updated in some cases.

Thus, clock gating of registers presents particular issues as it is necessary to ensure that the parity bit remains consistent at all times with the data stored in the register.

The inventors have devised circuit implementations and methods of performing error detection of clock gated signals or implementing parity checks while allowing the clock gating of the register updates. Also, these circuit implementations are designed to keep the power and area low while performing parity checking or cyclic redundancy checking. This is explained in detail using the following figures.

Figure 3A:
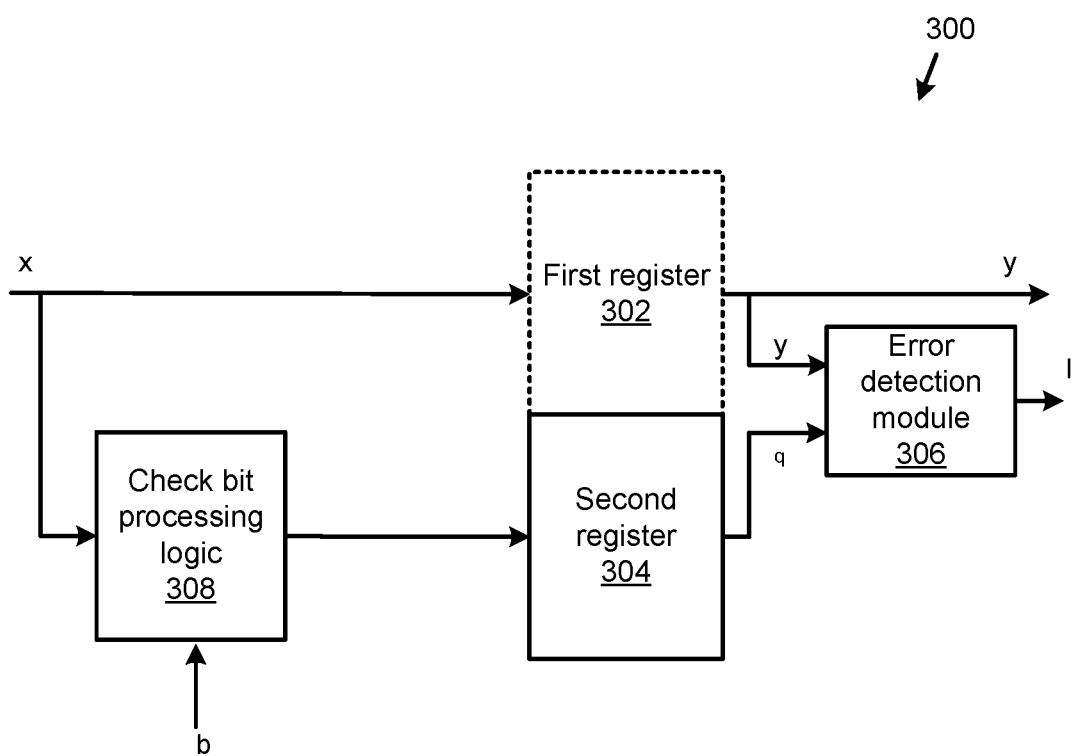
FIG. 3A is a block diagram of an error detection circuit for performing Cyclic Redundancy Checks (CRC) on clock gated register signals.
Figure 3B:
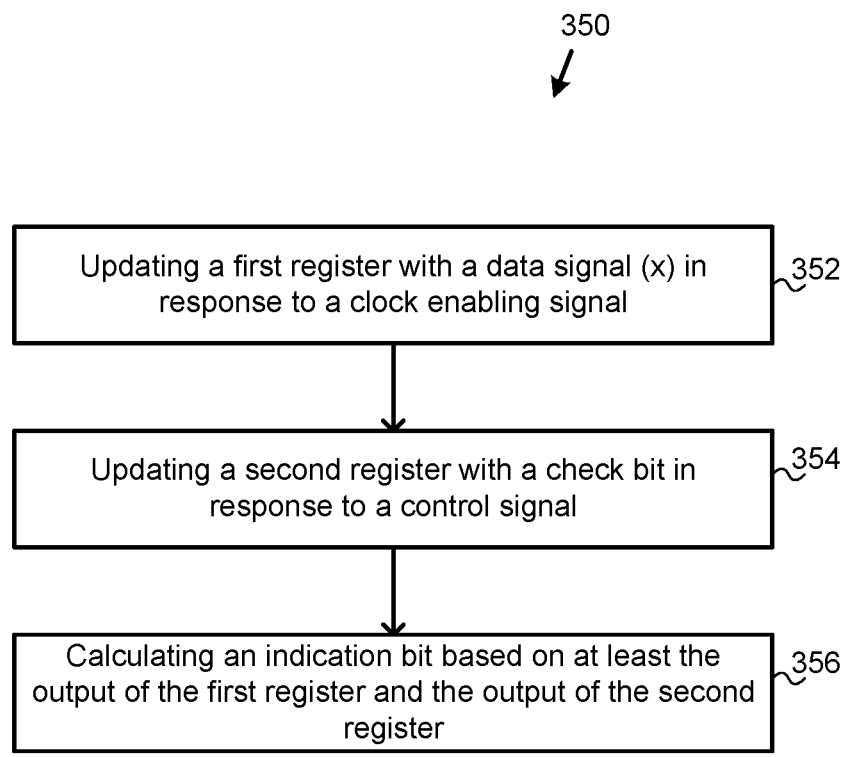
FIG. 3B is a flowchart explaining the method of performing CRC on a clock gated register signals.

FIG. 3A is a block diagram of an error detection circuit for performing Cyclic Redundancy Checks (CRC) on a clock gated register signal. The error detection circuit 300 comprises a first register 302, a second register 304, a check bit processing logic 308 and an error detection module 306. The first register 302 is drawn using dashed lines to represent a clock gated register. FIG. 3B is a flowchart explaining the method 350 of performing error detection on a clock gated register signal using the error detection circuit 300.

The first register 302 is a clock gated register i.e. a register having an internal clock gating circuitry/logic for gating clock signals, to the register, based on certain enabling conditions. The dashed lines are used to represent a register as a clock gated register throughout all the figures. The first register 302 is configured (at step 352) to be updated with a data signal in response to a clock enabling signal. The first register may receive a clock signal (clk) and a clock enabling signal as inputs to an internal clock gating circuitry of the first register. When the clock enabling signal enables the first register 302, the first register 302 is updated with a particular data signal (x) received as an input at the first register. When the clock gated register is not enabled by the clock enabling signal, then the first register 302 is not updated. Instead, the first register will continue to hold a data signal ($x_r$) (not shown in figure) which was updated when the first register was previously enabled using the clock enabling signal. In this implementation, when the clock enabling signal is high, the first register 302 is updated with a particular data signal (x) received as an input at the first register. When the clock gated register is not enabled i.e. when the clock enabling signal is low then the first register 302 is not updated, but will continue to hold a data signal ($x_r$) (not shown in figure) which was updated when the clock enabling signal was previously high i.e. during a previous clock cycle.

The second register 304 is a register configured for storing a calculated check bit. The second register 304 is not a clock gated register and hence can be updated without depending on the clock enabling signal (whether the clock gating is high or low). The second register 304 is updated with a new calculated check bit received from a check bit processing logic 308.

The check bit processing logic 308 calculates a check bit and outputs the calculated check bit to update the second register 304. The check bit processing logic 308 functions in response to a control signal b. The check bit processing logic 308 comprises a check bit calculation unit and a controlling unit. The check bit calculation unit performs the calculation of the check bit. The data signal (x) provided as an input to the first register 302 is also provided as an input to the check bit processing logic 308. Put another way, data signal (x) is split, and one part of the split signal is provided to the first register 302 and another part of the split signal is provided to the check bit processing logic 308. Therefore, when calculating a check bit based on that input, the check bit calculation unit is calculating a check bit based on the signal being provided to the first register 302. As such, the check bit can be used to detect any errors that occur as part of storing the signal in the first register 302. The controlling unit controls the output generated from the check bit processing logic in response to the control signal. In other words, the control signal controls the check bit processing logic to output an appropriate check bit to the second register 304 so that the check bit corresponds to the data signal stored in the first register 302. The functioning of the controlling unit (external to the second register) controlling the updating of the second register is similar to the selection happening internally inside the first register, such that the first register is updated with a new data value in response to the clock enabling signal. The control signal b may be the same as the clock enabling signal. The same clock enabling signal as provided to the first register 302 or a separate identical signal can be provided to the check bit processing logic 308 as control signal b.

The inventors devised that the check bit processing logic can be implemented in multiple ways to achieve the result of keeping the check bit in sync with the data in the first register. Depending on the implementation either the calculation of the new check bit or the output of the calculated check bit can be performed in response to the control signal. Once the check bit is calculated and outputted, the output of the check bit processing logic 308 is provided to the second register 304 and the second register is updated. That is, the second register is updated even if the first register is not, but the value in the second register is kept in sync with data in the first register (subject to any transient errors). In other words, the second register is a normal register (i.e. is not a clock gated register) updated irrespective of the clock enabling signal such that the value of the second register is kept in sync with the data in the first register.

Clock gating the second register to store the calculated check bit would be a default option considered by a person skilled in the art. However, using a second register which is a clock gated register has certain downsides. The first downside is that the calculation of the check bit by the check bit processing logic itself adds delay to the critical path, and therefore using clock gating adds extra bit of delay to the critical path. The second downside is that the calculation of the check bit consumes power, even if the result is not going to be registered in the second register.

The method described here of using the check bit processing logic functioning based on the control signal instead of using a clock gated second register has the following advantages. Using this approach, the calculation of the check bit is performed by the check bit processing logic conditional on the control signal b, hence saving power. Further the delay caused by clock gating of the second register for storing the check bit is saved. However, this has marginal saving on the delay caused in the critical path due to the presence of mux in the check bit processing logic. Therefore, this approach explained with respect to FIG. 3 is useful if there is enough time, i.e. another parallel path is critical.

The check bit may be a parity bit. In that case, the check bit can be calculated by performing the XOR reduce function or nXOR reduce function on the data signal as discussed with respect to FIGS. 1A and 1B.

As already mentioned, the second register is not clock gated and is updated with the check bit from the check bit processing logic 308 despite whether the clock enabling signal is low or high. However, the updating of the second register 304 occurs in response to the control signal as the functioning of the check bit processing logic is based on the control signal (step 354).

The output (y) from the first register 302 and the output (q) from second register 304 is provided to the error detection module 306. The error detection module 306 calculates an indication bit (I) based on at least the output of the first register 302 and the output of the second register 304 (step 356). The implementation of the error detection circuit 300 is explained in detail with respect to FIG. 4A and FIG. 5A.

Figure 4A:
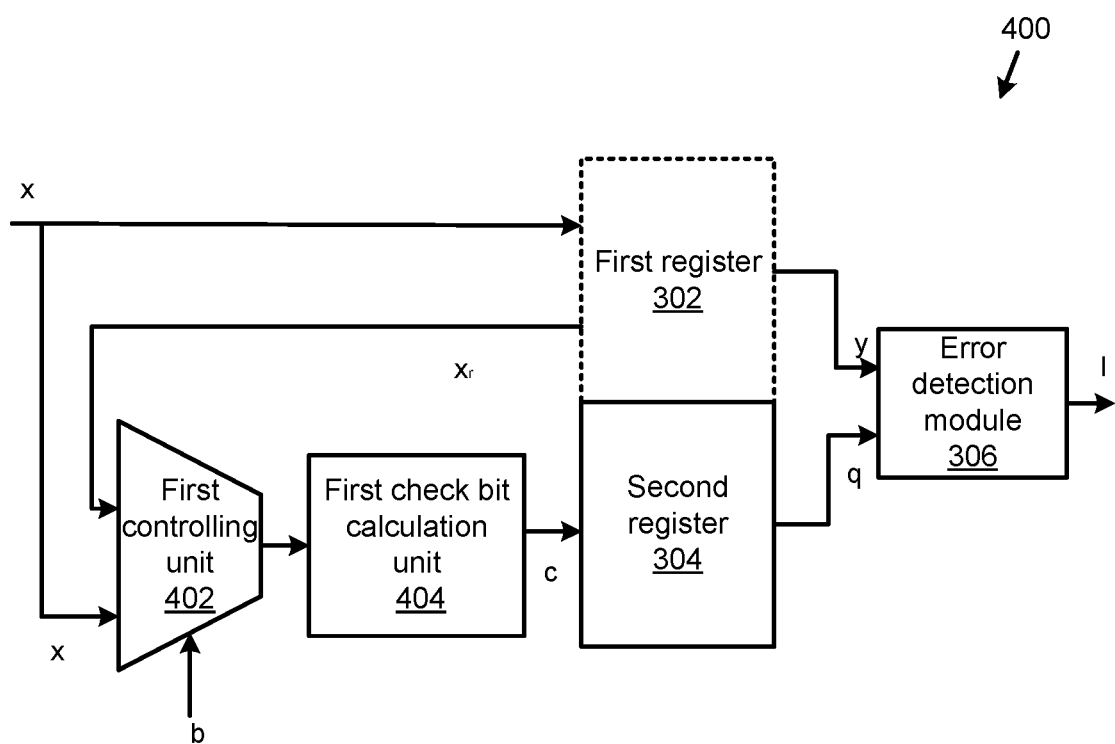
FIG. 4A is a block diagram of a first implementation of the error detection circuit of FIG. 3A.

FIG. 4A is a block diagram of an implementation of the error detection circuit of FIG. 3A. The error detection circuit 400 comprises a first register 302, a second register 304, and an error detection module 306 as discussed with respect to FIG. 3A. As discussed above the first register 302 is a clock gated register and is updated with a data signal in response to a clock enabling signal, which may correspond to control signal b provided to first controlling unit 402 as discussed below. More specifically, if the first register is enabled using the clock enabling signal, the first register 302 is updated with a data signal (x) received as an input. If the first register is not enabled by the clock enabling signal, the first register 302 will continue to hold a data signal $(x_r)$ already stored in the first register. The data signal $(x_r)$ is the signal which was updated to the first register 302 when the first register was previously enabled by the clock enabling signal. Thus, the output y from the first register 302 may be expressed, using the conditional (ternary) operator, as:

$$y=b?x:x_r$$

which means that y=x, when b=1 and $y=x_r$, when b=0

The circuit 400 comprises check bit processing logic comprising a controlling unit and a check bit calculation unit. In this first implementation, for clarity in comparison to the second implementation discussed later, the controlling unit may be referred to as a first controlling unit 402 and the check bit calculation unit may be referred to as a first check bit calculation unit 404 (for the avoidance of doubt, each of the first and second implementations only includes a single controlling unit and calculation unit, as shown in the figures).

In the first implementation, the calculation of the check bit is performed in response to the control signal b. The first controlling unit 402 controls the input to the first check bit calculation unit 404. The first controlling unit 402 selects one of the data signal (x) received at the first register and a data signal $(x_r)$ previously stored in the first register 302, and provides the selected data signal to the first check bit calculation unit 404. The first check bit calculation unit 404 calculates the check bit (c) based on the selected data signal provided by the first controlling unit 402. That is, the data signal (x), provided as an input to the first register 302, is also provided as an input to the first controlling unit 402. Put another way, data signal (x) is split, and one part of the split signal is provided to the first register 302 and another part of the split signal is provided to the first controlling unit 402. The data signal $(x_r)$ output by the first register is also provided as an input to the first controlling unit 402. It will be understood that the input and the output of the first register 302 are different signals, which may or may not have the same values depending on the circumstances. The first controlling unit 402 then selects which of its inputs should be used to calculate the check bit.

The first controlling unit 402 may be a mux with a control signal (e.g. corresponding to the clock enabling signal controlling the updating of the first register 302) as the control signal b and data signal (x) as a first input and the data signal ($x_r$) as a second input. Thus, the mux may be configured such that every time when the control signal goes high (i.e. when b=1), the first controlling unit selects the data signal (x) received at the first register 302 and provides it to the first check bit calculation unit. The first check bit calculation unit 404 then calculates the check bit based on the data signal (x) and outputs it to the second register. The check bit may be parity bit. Suppose the data signal (x) has a bit length of n bits. The first check bit calculation unit 404 calculates the check bit (c) (or parity bit) by performing XOR reduction or nXOR reduction of the n bits of the data signal (x) depending on whether the check bit calculation unit is implemented to perform an even parity check or odd parity check.

The check bit (c) calculated by the first check bit calculation unit when performing an even parity check on the data signal (x) is represented by equation:

$$c = XOR\_reduce(x)$$

and the check bit (c) calculated by the first check bit calculation unit when performing an odd parity check on the data signal (x) is represented by equation:

$$c = nXOR\_reduce(x)$$

Thus, the second register 304 is updated with the calculated check bit (c) when the control signal (the clock enabling signal) goes high. Further, the first register 302 is also updated with the data signal when the clock enabling signal goes high.

Further, if the control signal is low (i.e. when b=0), the first controlling unit 402 is configured to select the data signal ($x_r$) previously stored in the first register 302. The first check bit calculation unit 404 then calculates the check bit (c) based on the previously stored data signal ($x_r$) and outputs it to the second register. Suppose the previously stored data signal ($x_r$) has a bit length of m bits. The first check bit calculation unit 404 calculates the check bit (c) (or parity bit) by XOR reducing m bits of the data signal ($x_r$) or nXOR reducing the m bits of the data signal ($x_r$) depending on whether the check bit calculation unit is implemented to perform even parity check or odd parity check.

The check bit (c) calculated by the first check bit calculation unit when performing an even parity check on the data signa ($x_r$) is represented by equation:

$$c = XOR\_reduce(x_r) \text{ and}$$

the check bit (c) calculated by the first check bit calculation unit when performing an odd parity check on the data signa ($x_r$) is represented by equation:

$$c = nXOR\_reduce(x_r)$$

In other words, when b=0, the second register is updated with the new calculated check bit (c) based on the data signal ($x_r$) which is same as a check bit ($c_r$) which was previously stored in the second register 304. The check bit ($c_r$) was a corresponding value updated into the second register when the first register was updated with the data signal ($x_r$) (i.e. when the clock enabling signal was high in the previous clock cycle).

Thus, the second register 304 is updated with the calculated check bit (c) even when the control signal (the clock enabling signal) is low. In contrast, assuming the control signal b corresponds to the clock enabling signal controlling the updating of the first register, the first register 302 is not updated when the clock enabling signal b is low, i.e. the first register may continue to hold the previous stored data signal ($x_r$) when the clock enabling signal b is low. In other words, the second register is continually updated, even if the first register is not, but the value of the second register is kept in sync with the contents of the first register.

Thus, when performing an even parity check, the output of the second register 'q' can be expressed as $$q = b?XOR\_reduce(x):XOR\_reduce(x_r)$$

which means that q=XOR_reduce(x), when b=1 and $q = c_r = XOR\_reduce(x_r)$ when b=0.

Similarly, when performing an odd parity check, the output of the second register 'q' can be expressed as $$q = b?nXOR\_reduce(x):nXOR\_reduce(x_r)$$

which means that q=nXOR_reduce(x), when b=1 and $q = c_r = nXOR\_reduce(x\ r)$ when b=0.

Thus, the output from the first register 302 and second register 304 is provided to the error detection module 306. The error detection module 306 calculates an indication bit I based on at least the output (y) of the first register 302 and the output (q) of the second register 304.

Further, optionally a valid signal v stored in a third register (not shown in the figures) can be provided to the error detection module 306. A high valid signal indicates that the value updated in the first register is valid. If the valid signal is low, the data updated in the first register is considered as invalid. For example, the data signal stored in the first register may be an invalid signal when the device is reset in a previous clock cycle. The use of a valid signal eliminates any error detection caused due to invalid signal stored in the first register.

Again, the calculation of the indication bit by the error detection module is performed based on whether an even parity check and an odd parity check is done. indication bit I can be expressed as For an even parity check:

$$I = (XOR\_reduce(y) XOR\ q) AND\ v$$

Where when b=1, y=x and q=c=XOR_reduce(x) and when b=0, $y = x_r$ and $q = c_r = XOR\_reduce(x_r)$.

For an odd parity check:

$$I = (nXOR\_reduce(y) nXOR\ q) AND\ v$$

Where when b=1, y=x and q=c=XOR_reduce(x) and when b=0, $y = x_r$ and $q = c_r = XOR\_reduce(x_r)$ Thus, in both cases the check bit of the corresponding data signal is provided with the data signal to the error detection module thereby ensuring that the indication bit is calculated correctly as the first register is updated.

Figure 4B:
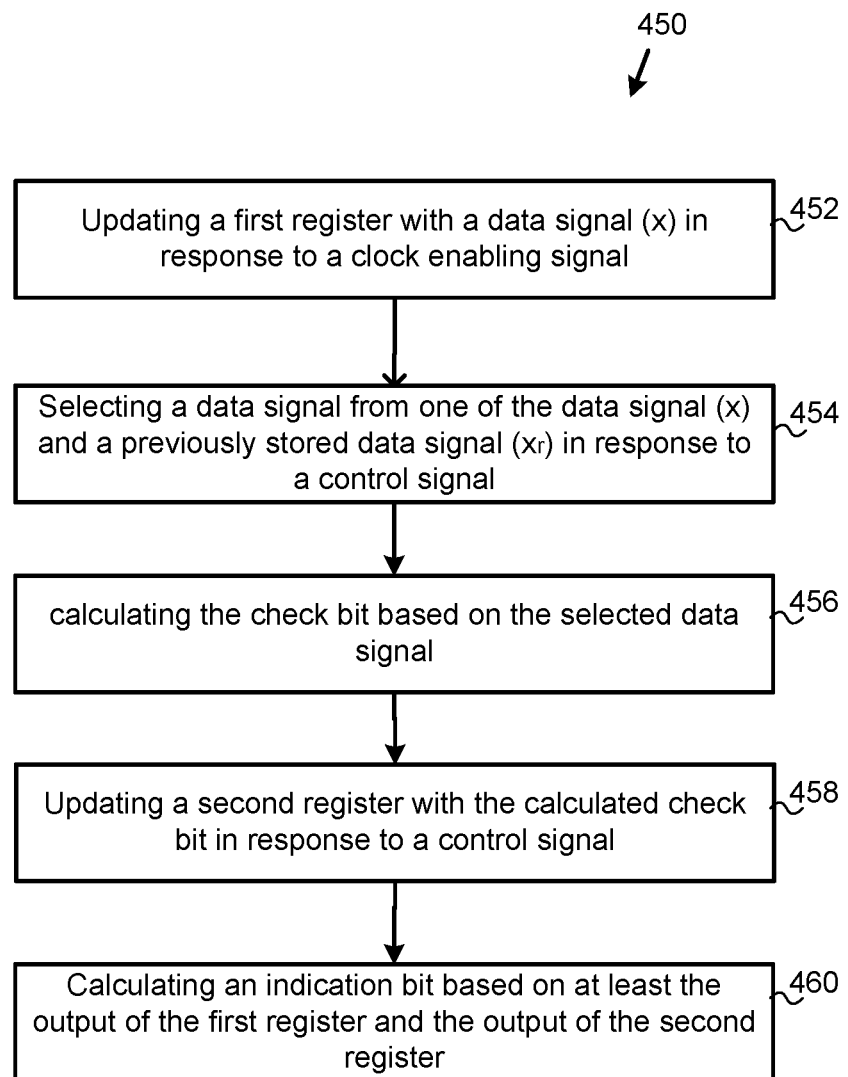
FIG. 4B is a flowchart explaining the method of performing CRC on a clock gated register signal using the first implementation of the error detection circuit of FIG. 4A.

FIG. 4B is a flowchart explaining the method of performing a CRC on a clock gated register signal using the first implementation of the error detection circuit of FIG. 4A.

The method, at step 452, includes receiving an input data signal (x) and updating a first register with the data signal (x) in response to a clock enabling signal. The first register is a clock gated register having an internal clock circuitry. Hence the first register is updated with a data signal when the first register is enabled, i.e. when the clock enabling signal (which may correspond to the control signal b provided to the first controlling unit 402) is high (b=1). When the clock enabling signal is low (b=0), the first register is disabled will continue to hold a previously stored data signal ($x_r$).

At step 454, the method includes selecting a data signal from one of the data signal (x) and a previously stored data signal ($x_r$) in response to a control signal b. The data signal (x) received as the input and the previously stored data signal ($x_r$) stored in the first register are separately provided to a check bit processing logic, comprising a check bit calculation unit and a controlling unit. The data signal (x) received is provided as a first input to the controlling unit and the previously stored data signal ($x_r$) stored in the first register is provided as a second input to the controlling unit. Further, the control signal b is provided as a third input to the controlling unit. The control signal b may be same as the clock enabling signal (e.g. corresponding to the clock enabling signal controlling the updating of the first register) and the controlling unit may be a mux.

The controlling unit selects one of the data signal (x) and the previously stored data signal ($x_r$) in response to the control signal b. The controlling unit selects the data signal (x) (i.e the first input) when the (gated) control signal b is high. Further, the controlling unit selects the previously stored data signal ($x_r$) (i.e. the second input) when the control signal b is low. The selected data signal is provided to the check bit calculation unit.

Thus, when the control signal is high the check bit calculation unit receives the selected data signal (x) and calculates the check bit (c) based on the data signal (x). Similarly, when the control signal is low the check bit calculation unit receives the selected previously stored data signal ($x_r$) and calculates the check bit (c) based on the data signal ($x_r$). At step 456, the method includes calculating a check bit based on the selected data signal. Thus, the check bit (c) is calculated by the check bit calculation unit in response to the control signal b. The check bit may be a parity bit. The output of the check bit calculation unit is provided to the second register.

Once the check bit is calculated, the method includes, at step 458, updating a second register with the calculated check bit in response to a control signal. The second register is not a clock gated register and hence can be updated irrespective of whether the control signal is high or low.

However, as discussed, the second register is updated with a check bit in response to the control signal b. In other words, as the check bit calculation unit calculates the check bit (c) based on the selected data signal (x) when the control signal b is high, the second register is updated with the check bit (c) corresponding to the data signal (x) when the control signal b goes high. And similarly, as the check bit calculation unit calculates the check bit (c) based on the selected previously stored data signal ($x_r$) when the control signal b is low, the second register is updated with the check bit (c) corresponding to the data signal ($x_r$) when the control signal b goes low.

At step 460, the method includes calculating an indication bit based on at least the output of the first register (y) and the output of the second register (q). The indication bit is calculated by an error detection module. The output of the first register is provided as a first input and the output of the second register is provided as a second input to an error detection module. The error detection module calculates the indication bit and detects if there is an error based on the indication bit. The indication bit may be a parity check bit or a parity fail indicating bit.

Thus, when the clock enabling signal and corresponding control signal b are high, the output of the first register (y) which is the received data signal (x) and the output of the second register (q) which is a calculated check bit (c) based on the data signal (x) are used for calculating the indication bit I.

Similarly, when the clock enabling signal and corresponding control signal b are low, the output of the first register (y) which is the previously stored data signal ($x_r$) and the output of the second register (q) which is a calculated check bit (c) based on the data signal ($x_r$) are used for calculating the indication bit I.

Figure 5A:
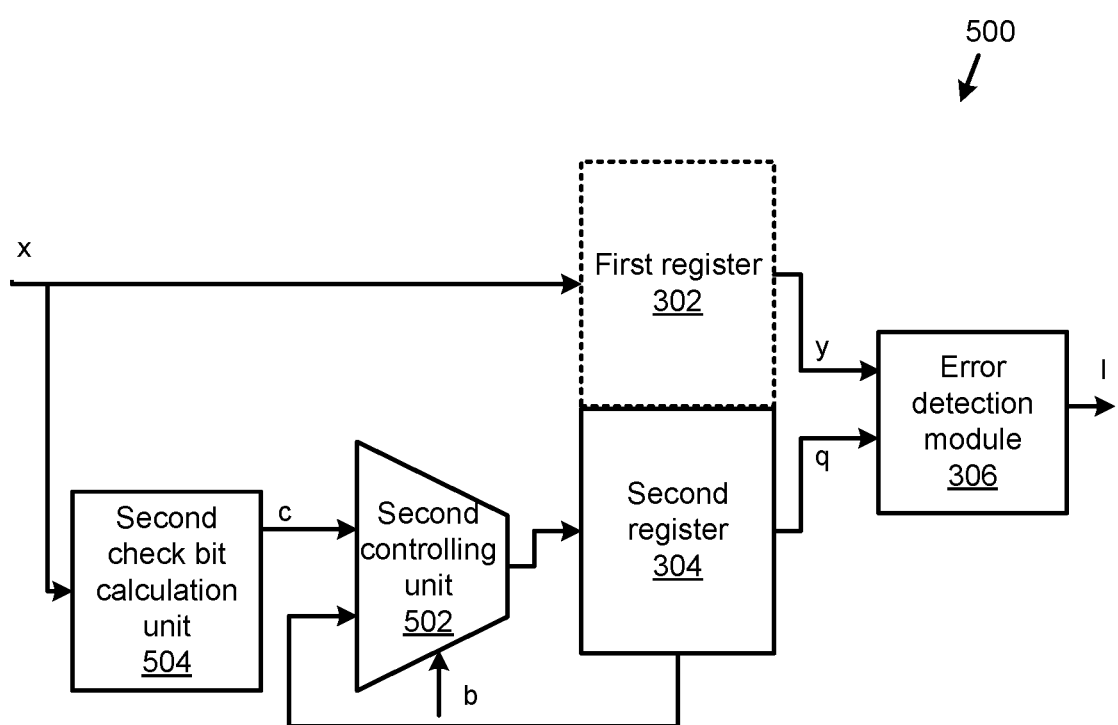
FIG. 5A is a block diagram of a second implementation of the error detection circuit of FIG. 3A.

FIG. 5A is a block diagram of a second implementation of the error detection circuit of FIG. 3A. The error detection circuit 500 in FIG. 5A comprises a first register 302, a second register 304, and an error detection module 306 as discussed with respect to FIG. 3A. As discussed above the first register 302 is updated with the data signal in response to a clock enabling signal (which may correspond to a control signal b provided to the second controlling unit 502, as discussed below). More specifically, if the first register is enabled in response to the clock enabling signal (for example when clock enabling signal is high (b=1)), the first register 302 is updated with a data signal (x) received as an input. If the first register is disabled (i.e. when clock enabling signal is low (i.e b=0)), the first register 302 will continue to hold a previously updated data signal ($x_r$) updated when the clock enabling signal was previously high. Thus, the output y from the first register 302 may be expressed, using the conditional (ternary) operator, as:

$$y = b ? x : x_r$$

which means that y=x, when b=1 and y=$x_r$, when b=0

The circuit 500 comprises check bit processing logic comprising a controlling unit and a check bit calculation unit. In the second implementation, said controlling unit may be referred to as a second controlling unit 502 and said check bit calculation unit may be referred to as a second check bit calculation unit 504.

The data signal (x) received as input to the first register 302 is also provided as an input to the second check bit calculation unit 504. That is the same data signal (x) is provided as an input to both the first register 302 and the second check bit calculation unit 504. On receiving a data signal (x), the second check bit calculation unit 504 calculates the check bit based on the data signal (x). The check bit may be a parity bit. Suppose the data signal (x) has a bit length of n bits. The second check bit calculation unit 504 calculates the check bit (c) by XOR reducing or nXOR reducing n bits of the data signal (x) depending on whether the check bit calculation unit is implemented to perform an even parity check or odd parity check. The check bit (c) calculated by the second check bit calculation unit can be expressed as For an even parity check:

$$c = XOR\_reduce(x) \text{ or}$$

For an odd parity check:

$$c = nXOR\_reduce(x)$$

The calculated check bit is provided as a first input to a second controlling unit 502. The second controlling unit 502 is a mux. The second controlling unit receives a previously calculated check bit ($c_r$) stored in the second register 304 as a second input. As will become apparent, the previously calculated check bit ($c_r$) was calculated by the second check bit calculation unit 504, and subsequently stored in the second register, when the first register was updated with the previously stored data signal x, (i.e. when the clock gating signal was last high). Further, the control signal b is provided as a third input to the controlling unit 502.

The second controlling unit 504 selects one of the calculated check bit (c) and a previously calculated check bit ($c_r$) based on the control signal b. Thus, each time when the control signal goes high (i.e. when b=1), the second controlling unit 502 selects the calculated check bit (c) based on the data signal (x) and outputs the calculated check bit (c) to the second register 304. Thus, the second register 304 is updated with the calculated check bit (c) in response to the control signal b.

Further, when the control signal is low (i.e. when b=0), the second controlling unit 502 selects the previously calculated check bit ($c_r$) already calculated based on the data signal ($x_r$) when the control signal was previously high. The previously calculated check bit ($c_r$) selected by the second controlling unit 502 is further output to the second register. Thus, the second register 304 is updated with the calculated check bit ($c_r$) when the control signal (the clock enabling signal) is low.

Thus, the output of the second register 'q' can be expressed as $q=b?c:c_r$ which means that q=c when b=1 and q=$c_r$ when b=0

Further, the output of the first register (y) and the output of the second register (q) are provided to the error detection module 306 to calculate an indication bit I. Therefore, if the clock enabling signal and corresponding control signal b go high, the error detection module 306 receives the output of the first register (y) as the updated data signal (x) and the output of the second register q as the check bit (c) calculated based on the data signal (x). Similarly when the clock enabling signal and corresponding control signal b go low, the error detection module 306 receives the output of the first register (y) as the previously stored data signal ($x_r$) and the output of the second register q as the check bit ($c_r$) calculated based on the data signal ($x_r$). Further, optionally a valid signal v stored in a third register (not shown in the figures) can be provided to the error detection module 306. The error detection module 306 further calculates an indication bit I based as the equations expressed as:

For an even parity check:

$I=(XOR\_reduce(y) XOR\ q) AND\ v$

For an odd parity check:

$I=(nXOR\_reduce(y) nXOR\ q) AND\ v$

Thus in both cases, the check bit of the corresponding data signal is provided with the data signal to the error detection module thereby ensuring that the indication bit is calculated correctly as the first register is updated.

As a result, as for the first implementation, the second implementation updates the second register every time a new data signal is received, even if the first register is not updated, but the value of the second register is kept in sync with the contents of the first register. In the case of the second implementation, a check bit is always calculated based on the current data signal, but that check bit is not necessarily used to update the second register and a previously calculated check bit may be used to update the second register instead. In contrast, in the first implementation, a newly calculated check bit is used to update the second register every time there is a new data signal, but the calculated check bit may either be based on the new data signal or the previous data signal stored in the first register. Thus, in the first implementation, no extra dynamic power is consumed when the input to the first check bit calculation unit is the previous data signal stored in the first register as there is no toggling of the bits.

Figure 5B:
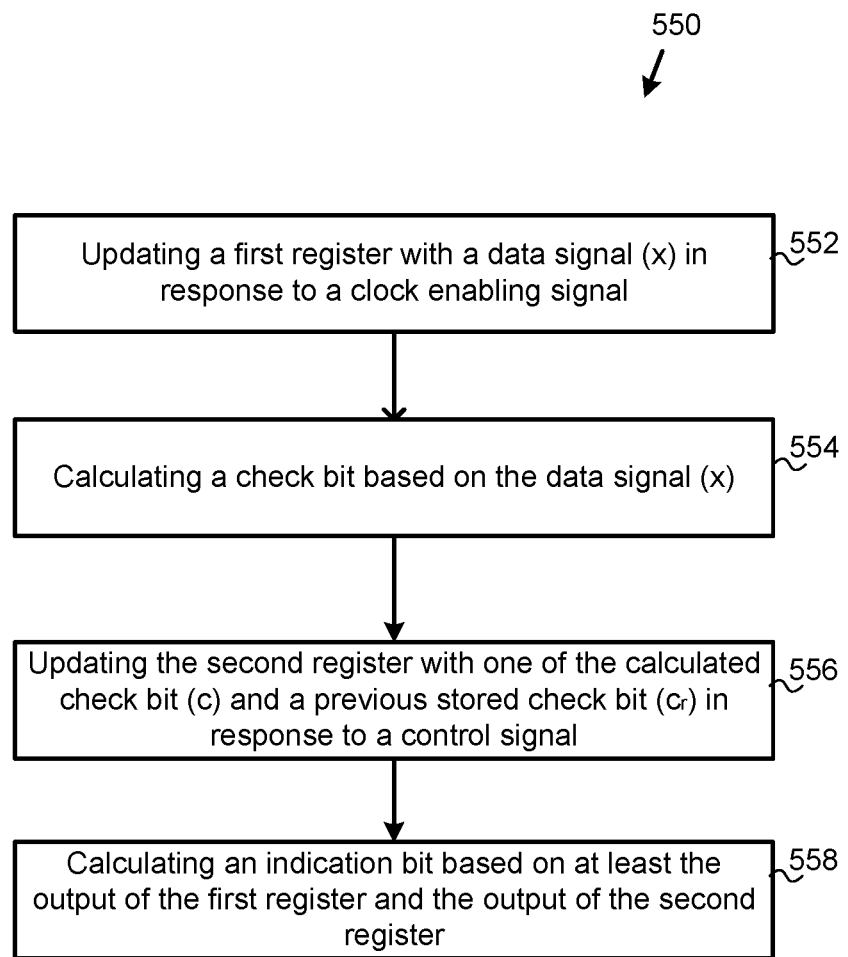
FIG. 5B is a flowchart explaining the method of performing CRC on a clock gated register signal using the second implementation of the error detection circuit of FIG. 5A.

FIG. 5B is a flowchart explaining the method of performing CRC on a clock gated register signal using the second implementation of the error detection circuit of FIG. 5A.

The method at step 552 includes receiving an input data signal (x) and updating a first register with the data signal (x) in response to a clock enabling signal. The first register is a clock gated register having an internal clock circuitry. Hence the first register is updated with the input data signal (x) when the clock enabling signal enables the first register. When the clock enabling signal disables the first register, the first register will continue to hold a previously stored data signal ($x_r$) which was stored in the first register when the first register was last enabled.

At step 554, the method includes calculating a check bit based on the input data signal (x). The data signal (x) is separately provided to a check bit processing logic, comprising a check bit calculation unit and a controlling unit. The check bit calculation unit calculates a check bit (c) corresponding to the data signal (x). The check bit may be a parity bit.

Once the check bit is calculated, the method includes at step 556 updating a second register with one of the calculated check bit (c) and a previously stored check bit ($c_r$) in response to a control signal. The previously stored check bit ($c_r$) was calculated by the check bit calculation unit corresponding to the data signal ($x_r$) when the control signal was last high and was stored into the second register.

Thus, the newly calculated check bit from the check bit calculation unit and the previously stored check bit are provided to the controlling unit. The controlling unit may be a mux. The controlling unit receives the calculated check bit from the check bit calculation unit as a first input. The controlling unit further receives the previously stored check bit ($c_r$) from the second register as a second input. Further, the controlling unit receives the control signal b as a third input. Further, the controlling unit updates the second register with one of the calculated check bit (c) and a preciously stored check bit ($c_r$) in response to a control signal. The controlling unit is configured to update the second register with the calculated check bit (c) (i.e the first input) when the gated control signal b is high. Further, the controlling unit is configured to update the second register with the preciously stored check bit ($c_r$) (i.e. the second input) when the control signal b is low.

At step 558, the method includes calculating an indication bit based on at least the output (y) of the first register and the output (q) of the second register. The indication bit is calculated by an error detection module. The output of the first register is provided as a first input and the output of the second register is provided as a second input to an error detection module. The error detection module calculates the indication bit and detects if there is an error based on the indication bit. The indication bit may be a parity check bit or a parity fail indicating bit.

Thus, when the first register is enabled in response to the clock enabling signal, the first register which is a clock gated register is updated with the received data signal (x) and the second register is updated with a calculated check bit (c). The error detection module receives the data signal (x) as the first input and the check bit (c) as the second input for calculating the indication bit.

Similarly, when the first register is disabled in response to the clock enabling signal, the first register which is a clock gated signal is not updated with the received data signal (x)

and hence the first register continues to hold a previously stored data signal ($x_r$). Further, the second register is updated with the check bit ($c_r$) which was previously stored in the second register. The error detection module receives the previously stored data signal ($x_r$) and the previously stored check bit ($c_r$) for calculating the indication bit.

In the circuits 300, 400 and 500, the power consumed by both the first and the second registers are comparatively less. This is because the first register being a clock gated signal consumes less power compared to a normal register as the register update takes power only when the value is changed, i.e when the clock enabling signal is high. Similarly, though the second register is a normal register (i.e. not a clock gated register), as the second register is updated in response to a control signal, the updating of the second register consumes less power. This is again because a register update takes power only when the value is changed. That is the second register update draws power only when the control signal is high and the value of check bit changes. In contrast, if the second register was directly updated based only on the data signal (x), the data signal could change whilst the first register is clock gated (and so not updated), causing a new check bit to be calculated and stored, which would not only increase power consumption but also mean the stored check bit no longer corresponded to the data stored in the first register. Further, in these circuit implementations there is no need to store the clock enabling signal separately for ensuring the correctness in checking the error in the clock gated register signal, which if done would have cost more area and power.

The different implementations of error detection circuits 300, 400 and 500 discussed based on FIGS. 3A, 4A and 5A enable calculating the check bit and indication bit accurately when a clock gated register is updated with a data value due to the selection process happening in the controlling unit. Though the above implementations ensure correctness in detecting error in clock gated signals, there is a trade of in area and power usage due to the use of larger circuit logics for controlling unit (such as mux). Also, the use of mux may cause these implementations of circuit to be extra challenging to meet the time and area calculation.

Thus, the implementations of circuit 300, 400 and 500 can be more effectively used for checking errors in special registers such as control registers which are not timing critical. As control registers tend not to be timing critical so the impact of having the extra controlling unit (mux) is not an issue for the overall timing of the circuit. Further, in control registers there can be several signals, each with unique clock enabling signals. As the different implementations of circuit 300 do not require to register clock enabling signals, these implementations may be preferred to check control registers as the area and power usage caused by extra registers for registering the clock enabling signals can be foregone.

However, for checking errors in updating certain other registers (such as some data registers) which are timing critical, the addition of the controlling unit (mux) could be challenging to meet existing timing requirements. The inventors, therefore, devised an error detection circuit and method for performing error detection on a clock gated register signal without using a separate controlling unit or mux.

Figure 6A:
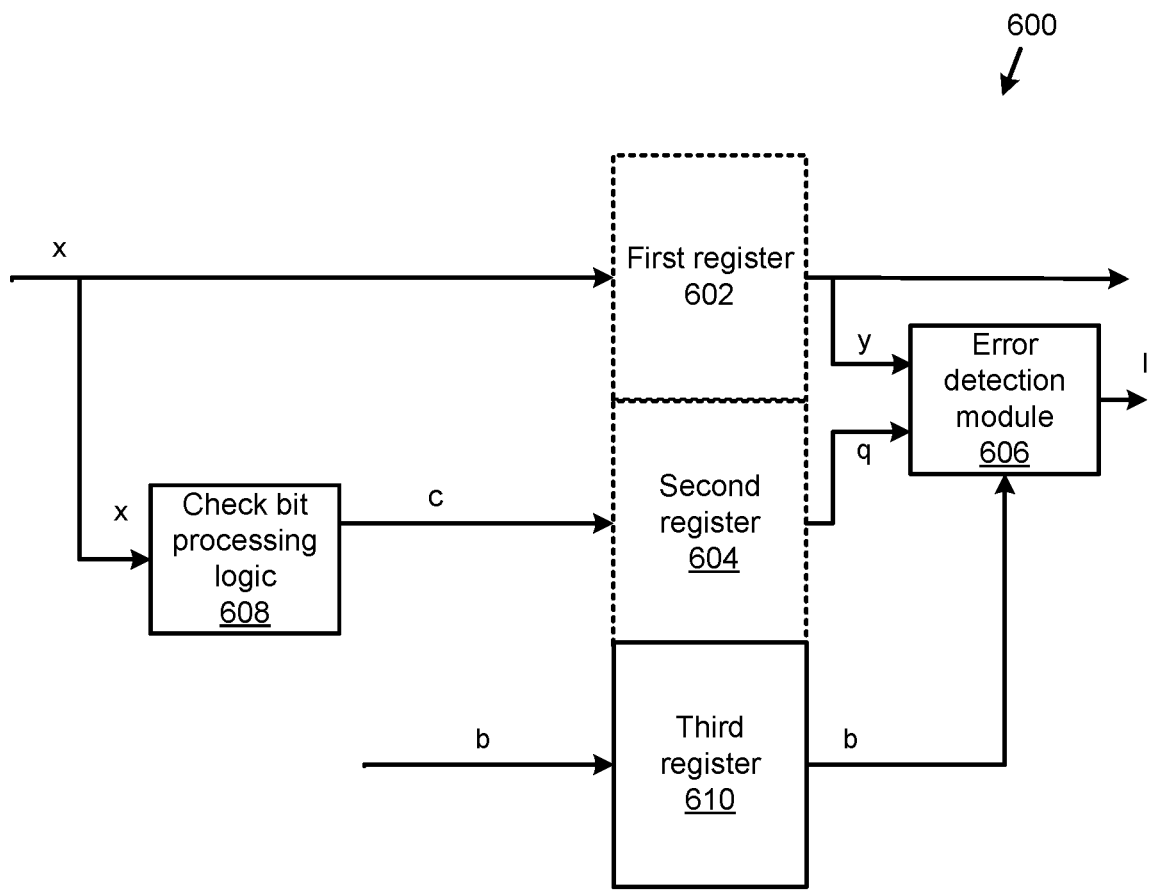
FIG. 6A is a block diagram of another error detection circuit for performing CRC on a clock gated register signal.
Figure 6B:
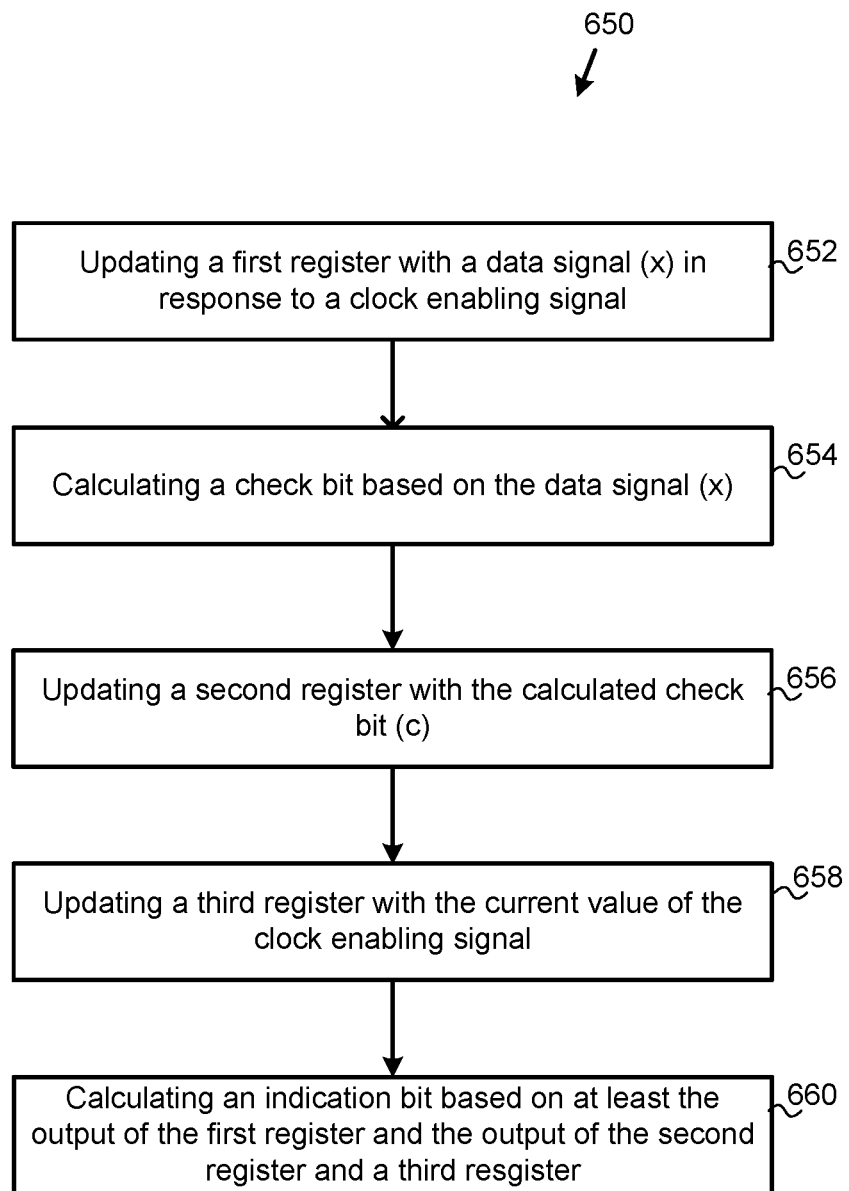
FIG. 6B is a flowchart explaining the method of performing CRC on a clock gated register signal.
Figure 6C:
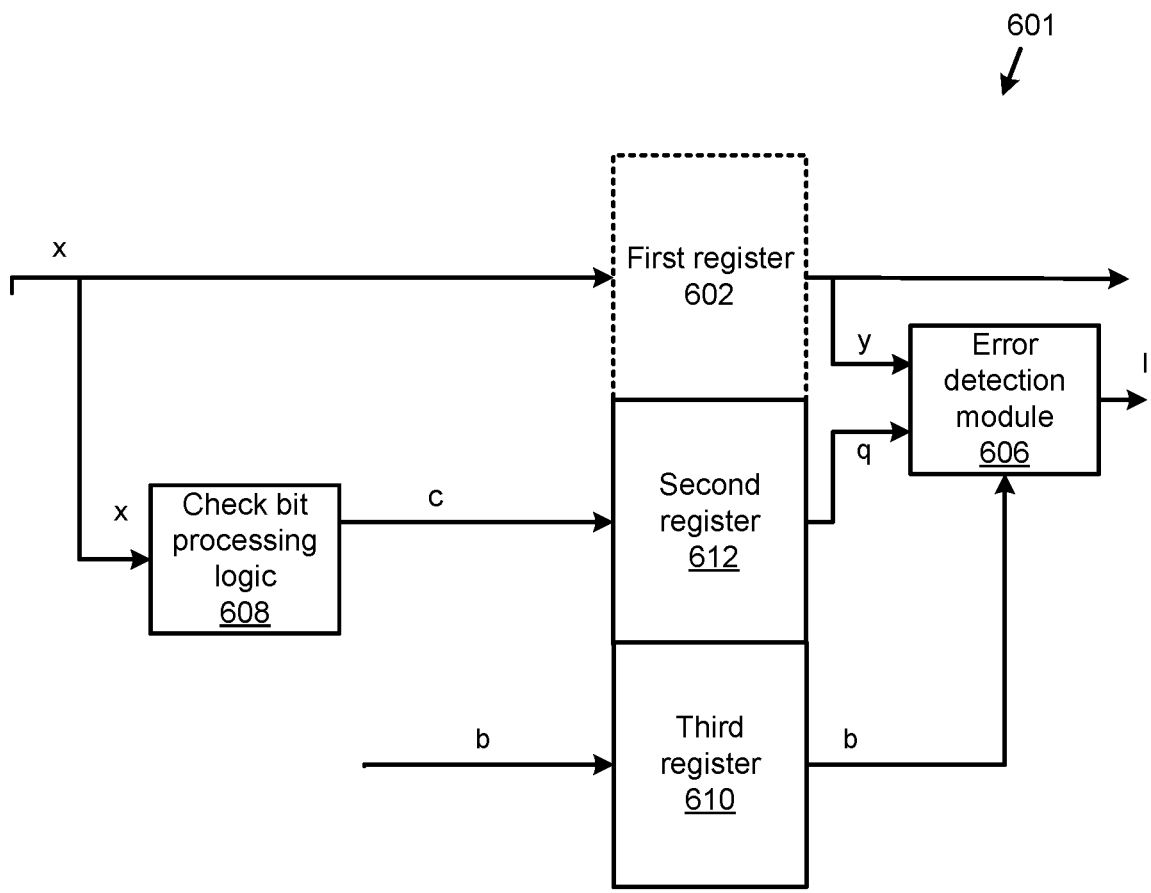
FIG. 6C is a block diagram of yet another error detection circuit for performing CRC on a clock gated register signal.

FIG. 6C is a block diagram of an error detection circuit for performing CRC on a clock gated register signal. FIG. 6B is a flowchart explaining the method of performing CRC on a clock gated register signal. The error detection circuit 601 in FIG. 6C comprises a first register 602, a second register 612, a third register 610, a check bit processing logic 608 and an error detection module 606.

The first register 602 (drawn using dashed lines) is a clock gated register i.e. a register having an internal clock gating circuitry/logic for gating clock signals to the register based on certain enabling conditions as described above. The first register 602 is configured to receive a data signal (x) and to be updated (at step 652) with a data signal (x) in response to a clock enabling signal. The clock enabling signal is not shown as an input to the first register (or the second register) in FIG. 6C for the sake of simplicity, but the clock enabling signal is the same as (or is equivalent to) signal b shown as an input to the third register 610 in FIG. 6C (and further discussed below). Thus, the first register is updated when the clock enabling signal enables the first register. When the first register 602 is disabled in response to the clock enabling signal, then the first register is not updated. Instead, the first register will continue to hold the data signal ($x_r$) which was updated during a previous clock enabling signal as explained with respect to the circuits 300-500. Thus, the output y from the first register 602 may be expressed as:

$$y=b?x:x_r$$

which means that y=x, when b=1 and y=x 1, when b=0.

The second register 612 is a normal register, i.e. not a clock gated register, and hence can be updated irrespective of the clock enabling signal (whether the clock enabling signal provided to the first register is high or low). The second register 612 is configured for storing a calculated check bit (c). Thus, when the first register is updated with a new data value, the second register is also simultaneously updated with the newly calculated check bit. That is, the data signal (x) provided as an input to the first register 602 is also provided as an input to the check bit processing logic 608 (which outputs a check bit to the second register 612). Put another way, data signal (x) is split, and one part of the split signal is provided to the first register 602 and another part of the split signal is provided to the check bit processing logic 608. Therefore, when calculating a check bit based on that input, the check bit processing logic 608 is calculating a check bit based on the signal being provided to the first register 602. As such, the check bit can be used to detect any errors that occur as part of storing the signal in the first register 602.

The check bit (c) is calculated by a check bit processing logic 608. The check bit processing logic 608 calculates a check bit and outputs the calculated check bit to update the second register 612. The check bit processing logic 608 comprises a check bit calculation unit. The check bit calculation unit performs the calculation of the check bit (c) always based on the data signal (x) (at step 654). The check bit may be a parity bit. The check bit can be calculated by performing XOR reduce function or nXOR reduce function on the data signal. The check bit (c) calculated by the check bit calculation unit can be expressed as For an even parity check:

$$c=XOR\_reduce(x) \text{ or}$$

For an odd parity check:

$$c=nXOR\_reduce(x)$$

The check bit processing logic 608 calculates a check bit and outputs the calculated check bit to update the second register 612 (at step 654). The calculation of the check bit is unconditional i.e. is performed irrespective of whether the control signal b is high or low.

The second register 612 is updated with a newly calculated check bit received from a check bit processing logic 608 (at step 656). Prior to updating the second register 612 with the newly calculated check bit, the second register 612 will continue to hold the check bit ($c_r$) calculated based on a previously stored data signal ($x_r$). In FIG. 6C, the second register 612 is a normal register and hence the second register is updated with the new calculated check bit irrespective of whether the clock enabling signal is high or low. Thus, the output of the second register 'q' can be expressed as:

$$q=c$$

which means that q is always updated as newly calculated c

Further, the third register 610 is configured for holding the current value of the clock enabling signal (b) (step 658). The third register 610 is also a normal register, i.e. not a clock gated register, and hence can be updated irrespective of the clock enabling signal (whether the clock enabling signal is high or low).

In the circuit 601 in FIG. 6C, the third register for storing the clock enabling signal, as signal b, is necessary for ensuring the correctness in calculating an indication bit by the error detection modules for every clock enabling signal. This is because the indication bit would be calculated only when the third register is updated with a value b=1 and hence the value stored in the third register enables to ensure that the appropriate check bit corresponding to the data signal (which is newly updated in the first register when b=1) is updated to the second register 612 while calculating the indication bit. Therefore, calculating the check bit only when b=1 ensures that the first register 602 and the second register 612 are updated with the appropriate values when calculating the check bit.

Thus, using a combination of the second register 612 and a third register 610 for storing the clock enabling signal value enables accurate calculation of the indication bit while ensuring meeting the clock frequency or timing compared to using a multiplexer circuit in the error detection circuit as shown in circuits 300, 400 and 500. Thus, the advantage of the error detection circuit 601 is that in the error detection circuit 601 the clock gating register is removed from the critical path, thereby eliminating the delay of clock gating in the critical path.

An optional valid signal may be stored in a separate register (not shown in the figure) for ensuring the correctness of the check by indicating whether the data signal stored is valid or not, as discussed earlier.

The output from the first register 602, the second register 612 and the third register 610 are provided to the error detection module 606. Optionally a valid signal v stored in a fourth register is also provided to the error detection module 606. The error detection module 606 calculates an indication bit based on at least the output of the first register 602, the output of the second register 612 and the output of the third register 610 (step 660).

Thus, calculated indication bit I can be expressed as
For an even parity check:

$$I=(XOR\_reduce(y) XOR\ q) AND\ v\ AND\ b$$

For an even parity check:

$$I=(nXOR\_reduce(y) nXOR\ q) AND\ v\ AND\ b$$

The error detection circuit 601 can be used for calculating the indication bit iteratively.

Further in some unusual situations, such as when resetting a component, an error may be introduced into the calculation of the indication bit as discussed below. For example, suppose there is a fourth register storing a valid signal. When we reset the component, the valid signal (in the fourth register) becomes low and the data currently in the first register 602 is kept, but is considered junk. Then consider the first time after reset that valid data is being sent to the fourth register, and that the clock-gating signal b is low. After this, the calculation of the indication bit depends entirely on the previously stored data signal ($y=x_r$) and previously stored check bit ($q=c_r$) stored in the first register and the second register respectively, which would be the value in the register out of reset and could be undetermined. This could introduce error in the calculation of the indication bit generating an indication bit=1, based on previous data. Thus, it becomes necessary to force the value of the indication bit to be low using the clock enabling signal, as signal b, in the third register.

In such situations, to eliminate the error in calculating the indication bit, a clock gated register can be used as a second register thereby ensuring that the second register is updated with the newly calculated check bit only when the second register is enabled using the clock enabling signal. This approach has, as discussed above, the drawback of increased area and power. However, it eliminates the false positives over several clock cycles. This is explained a bit more detail with reference to FIG. 6A below.

FIG. 6A is a block diagram of another error detection circuit for performing CRC on a clock gated register signal. The error detection circuit 600 comprises a first register 602, a second register 604, a third register 610, a check bit processing logic 608 and an error detection module 606.

The first register 602 as discussed with respect to FIG. 6C (drawn using dashed lines) is a clock gated register and is configured to receive a data signal (x) and to be updated (at step 652) with a data signal (x) in response to a clock enabling signal.

The second register 604 (also drawn using dashed lines) is also a clock gated register i.e. a register having an internal clock gating circuitry/logic for gating clock signals to the register based on certain enabling conditions. The second register 604 is configured for storing a calculated check bit (c) in response to a clock enabling signal. The same clock enabling signal (equivalent to the signal b shown as an input to the third register in FIG. 6A) provided to the first register 602 or a separate but identical clock enabling signal can be provided to the second register 604.

The second register 604 is thus different from the second register 612 in the circuit 601 and the second register 304 in the circuits 300, 400 and 500 (which are not clock gated registers). The use of the multiplexer in the circuits 300, 400 and 500 for ensuring that the second register is kept in sync with the contents of the first register is achieved in the circuit 600 using a clock gated register instead of the normal register. The use of second register 604 as a clock gated register enables the selection process of whether to update the second register with a calculated check bit or not. As mentioned earlier, the same clock enabling signal provided to the first register 302 or a separate identical clock enabling signal can be provided to the second register 604. In other words, both the first register 302 and the second register 604 is updated on the same conditions. Thus, when the first register is updated, the second register is also simultaneously updated with the newly calculated check bit.

The check bit (c) is calculated by a check bit processing logic 608. The check bit processing logic 608 calculates a check bit and outputs the calculated check bit to update the second register 604 as discussed with respect to FIG. 6C above. The check bit processing logic 608 comprises a check bit calculation unit. The check bit calculation unit performs the calculation of the check bit (c) always based on the data signal (x) (at step 654). That is, the same data signal (x) provided as an input to the first register 602 is also provided as an input to the check bit processing logic 608 (which outputs a check bit to the second register 604). Put another way, data signal (x) is split, and one part of the split signal is provided to the first register 602 and another part of the split signal is provided to the check bit processing logic 608. Therefore, when calculating a check bit based on that input, the check bit processing logic 608 is calculating a check bit based on the signal being provided to the first register 602. As such, the check bit can be used to detect any errors that occur as part of storing the signal in the first register 602.

The second register 604 is updated with a new calculated check bit received from a check bit processing logic 608 (at step 656). In FIG. 6A, the second register 604 is updated with the new calculated check bit when the second register is enabled in response to the clock enabling signal. When the second register is disabled in response to the clock enabling signal, then the second register is not updated. Instead, the second register will continue to hold the check bit ($c_r$) calculated based on a previously stored data signal ($x_r$) which was updated when the clock enabling signal was last high. Thus, the output of the second register 'q' can be expressed as (taking b as the clock enabling signal):

$$q=b?c:c_r$$

which means that q=c, when b=1 and q=$c_r$, when b=0

Further, the third register 610 is configured for holding the current value of the clock enabling signal, as signal b, (step 658) as discussed with respect to FIG. 6C above. The third register 610 is a normal register, i.e. not a clock gated register, and hence can be updated irrespective of the clock enabling signal (whether the clock enabling signal is high or low).

The output from the first register 602, the second register 604 and the third register 610 are provided to the error detection module 606. That is, the output from the first register 602, the second register 604 and the third register 610 are provided as inputs to the error detection module 606. Optionally a valid signal v stored in a fourth register is also provided to the error detection module 606. The error detection module 606 calculates an indication bit based on at least the output of the first register 602, the output of the second register 604 and the output of the third register 610 (step 660) as discussed with respect to FIG. 6C above.

In the circuits 600 and 601, an additional layer of error detection could be implemented to ensure the correctness of updating of the third register 610 as well. In that case, an extra separate error detection circuit would need to be implemented to check if the clock enabling signal is updated correctly. Such additional layers of error detection could be repeated to meet a desired standard/level of reassurance.

Further, it may be the case that for certain data registers the clock enabling signals are already stored (i.e. in further registers) as a part of the circuit. As such, this implementation can reuse such stored clock enabling signals/registers. For example, in data registers, we can have a large amount of data that is clock-gated with the same clock gated signal b. As part of the functionality, it may be required that the clock enabling signal b is registered. However, if the existing circuit design already has a register storing the clock enabling signal, then when implementing the error detection circuit 600 that existing register can be used as the third register that is part of the design of the circuit 600. In other words, there is no need of a further additional register to use as the third register of the design, and thus the additional area or power cost of a further register is eliminated.

Further, the use of a second register 604 (which is clock gated register) with the third register 610 for storing the clock enabling signal would also eliminate false positive failures occurring over several cycles in calculating the indication bit. A false positive failure is a situation where a data signal is updated correctly, but the check bit itself suffers from a bit flip. In the example described in the previous paragraph, suppose we are in a false positive situation, that is the first register 602 is updated correctly, but the second register 604 is not, then with b=1 and v=1 in the third and fourth register, the indication bit I is calculated as 1, which might be interpreted to mean that there is an error in the data stored in the first register, when in fact there is an error in the calculated check bit. Then there can occur two possible scenarios. In a first scenario, the valid signal v can remain high for several cycles, but first, second and the third register do not update, then the indication bit stays high over these several cycles due to the original false positive.

Further, in a second scenario, a new data signal is received. Suppose the third register may be updated with a value b=0 when the clock enabling signal goes from 1 to 0 and stays low for several cycles and the valid signal in the fourth register stays high for several cycles. Since the first register and the second register are clock gated registers, when the clock enabling signal goes from 1 to 0, the first and the second registers are not updated, but they would continue to hold the previous values stored in these registers. Suppose the indication bit is high (as the data signal is updated incorrectly). In this situation, if the value of clock enabling signal stored in the third register was not used in the calculation of indication bit, then the indication bit would have remained high=1 for several cycles, so the consecutive positives would have remained over several clock cycles. However now that we have the third register 610 updated with b=0, the indication bit is calculated as 0 and so the consecutive positives are removed.

Thus, as discussed above, using the error detection circuit 600, it is possible to remove the more complex check bit processing logics of the previous implementations from the critical path of the design (i.e. before the registering of the signals) and hence it is easier to apply this approach to existing designs without upsetting timing considerations. More specifically, it is possible to remove the controlling unit (such as mux) from the critical path of the design and hence it is easier to meet timing constraints. The circuit 600 is more expensive compared to the circuit 300 as an extra clock gated register is used as the second register. However, there is a trade off as the controlling unit is removed, and thus the area of the design is also reduced.

Figure 7:
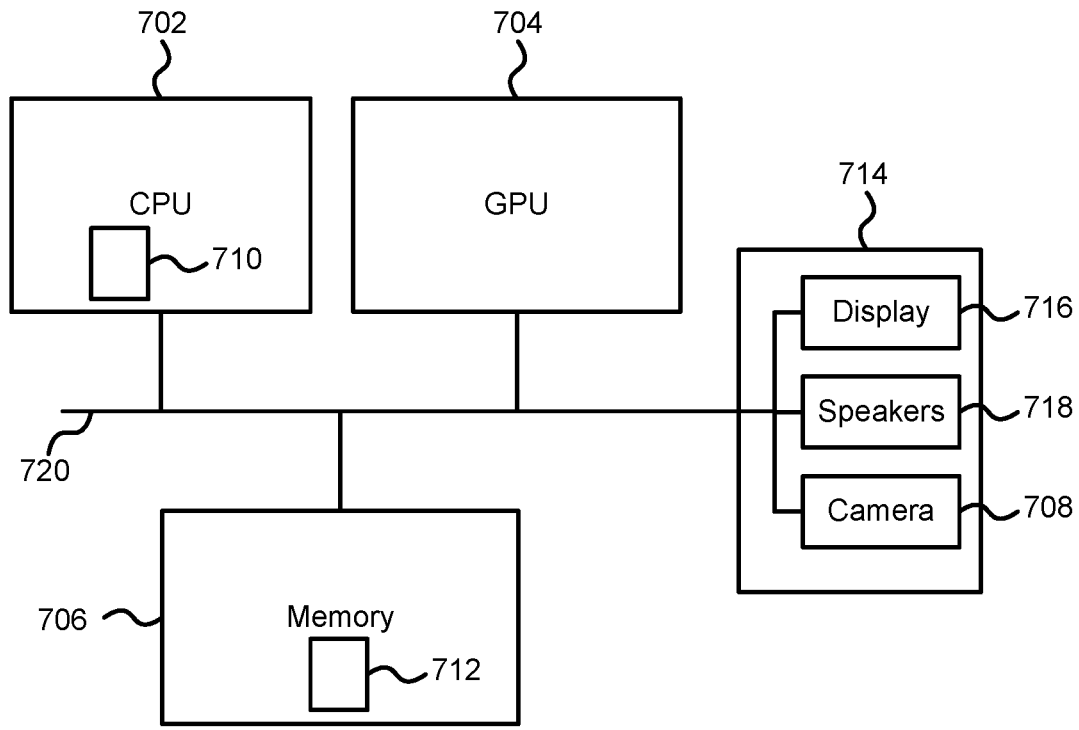
FIG. 7 shows a block diagram of a computer system.

FIG. 7 shows a computer system in which the graphics processing systems described herein may be implemented. The computer system comprises a CPU 702, a GPU 704, a memory 706 and other devices 714, such as a display 716, speakers 718 and a camera 722. A processing block 710 (corresponding to processing blocks 300) is implemented on the GPU 704, as well as a Neural Network Accelerator (NNA) 711. In other examples, the processing block 710 may be implemented on the CPU 702 or within the NNA 711. The components of the computer system can communicate with each other via a communications bus 720. A store 712 (corresponding to store 712) is implemented as part of the memory 702.

While FIG. 7 illustrates one implementation of a graphics processing system, it will be understood that a similar block diagram could be drawn for an artificial intelligence accelerator system—for example, by replacing either the CPU 702 or the GPU 704 with a Neural Network Accelerator (NNA) 711, or by adding the NNA as a separate unit. In such cases, again, the processing block 710 can be implemented in the NNA.

The error detection circuits 300 and 600 of FIG. 3-6 are shown as comprising a number of functional blocks. This is schematic only and is not intended to define a strict division between different logic elements of such entities. Each functional block may be provided in any suitable manner. It is to be understood that intermediate values described herein as being formed by an error detection circuits 300 and 600 need not be physically generated by the error detection circuits 300 and 600 at any point and may merely represent logical values which conveniently describe the processing performed by the error detection circuits 300 and 600 between its input and output.

The error detection circuits 300 and 600 described herein may be embodied in hardware on an integrated circuit. The error detection circuits 300 and 600 described herein may be configured to perform any of the methods described herein. Generally, any of the functions, methods, techniques or components described above can be implemented in software, firmware, hardware (e.g., fixed logic circuitry), or any combination thereof. The terms "module," "functionality," "component", "element", "unit", "block" and "logic" may be used herein to generally represent software, firmware, hardware, or any combination thereof. In the case of a software implementation, the module, functionality, component, element, unit, block or logic represents program code that performs the specified tasks when executed on a processor. The algorithms and methods described herein could be performed by one or more processors executing code that causes the processor(s) to perform the algorithms/methods. Examples of a computer-readable storage medium include a random-access memory (RAM), read-only memory (ROM), an optical disc, flash memory, hard disk memory, and other memory devices that may use magnetic, optical, and other techniques to store instructions or other data and that can be accessed by a machine.

The terms computer program code and computer readable instructions as used herein refer to any kind of executable code for processors, including code expressed in a machine language, an interpreted language or a scripting language. Executable code includes binary code, machine code, bytecode, code defining an integrated circuit (such as a hardware description language or netlist), and code expressed in a programming language code such as C, Java or OpenCL. Executable code may be, for example, any kind of software, firmware, script, module or library which, when suitably executed, processed, interpreted, compiled, executed at a virtual machine or other software environment, cause a processor of the computer system at which the executable code is supported to perform the tasks specified by the code.

A processor, computer, or computer system may be any kind of device, machine or dedicated circuit, or collection or portion thereof, with processing capability such that it can execute instructions. A processor may be or comprise any kind of general purpose or dedicated processor, such as a CPU, GPU, NNA, System-on-chip, state machine, media processor, an application-specific integrated circuit (ASIC), a programmable logic array, a field-programmable gate array (FPGA), or the like. A computer or computer system may comprise one or more processors.

It is also intended to encompass software which defines a configuration of hardware as described herein, such as HDL (hardware description language) software, as is used for designing integrated circuits, or for configuring programmable chips, to carry out desired functions. That is, there may be provided a computer readable storage medium having encoded thereon computer readable program code in the form of an integrated circuit definition dataset that when processed (i.e. run) in an integrated circuit manufacturing system configures the system to manufacture an error detection circuits 300 and 600 configured to perform any of the methods described herein, or to manufacture an error detection circuits 300 and 600 comprising any apparatus described herein. An integrated circuit definition dataset may be, for example, an integrated circuit description.

Therefore, there may be provided a method of manufacturing, at an integrated circuit manufacturing system, an error detection circuits 300 and 600 as described herein. Furthermore, there may be provided an integrated circuit definition dataset that, when processed in an integrated circuit manufacturing system, causes the method of manufacturing an error detection circuits 300 and 600 to be performed.

An integrated circuit definition dataset may be in the form of computer code, for example as a netlist, code for configuring a programmable chip, as a hardware description language defining hardware suitable for manufacture in an integrated circuit at any level, including as register transfer level (RTL) code, as high-level circuit representations such as Verilog or VHDL, and as low-level circuit representations such as OASIS® and GDSII. Higher level representations which logically define hardware suitable for manufacture in an integrated circuit (such as RTL) may be processed at a computer system configured for generating a manufacturing definition of an integrated circuit in the context of a software environment comprising definitions of circuit elements and rules for combining those elements in order to generate the manufacturing definition of an integrated circuit so defined by the representation. As is typically the case with software executing at a computer system so as to define a machine, one or more intermediate user steps (e.g. providing commands, variables etc.) may be required in order for a computer system configured for generating a manufacturing definition of an integrated circuit to execute code defining an integrated circuit so as to generate the manufacturing definition of that integrated circuit.

An example of processing an integrated circuit definition dataset at an integrated circuit manufacturing system so as to configure the system to manufacture an error detection circuits 300 and 600 will now be described with respect to FIG. 8.

Figure 8:
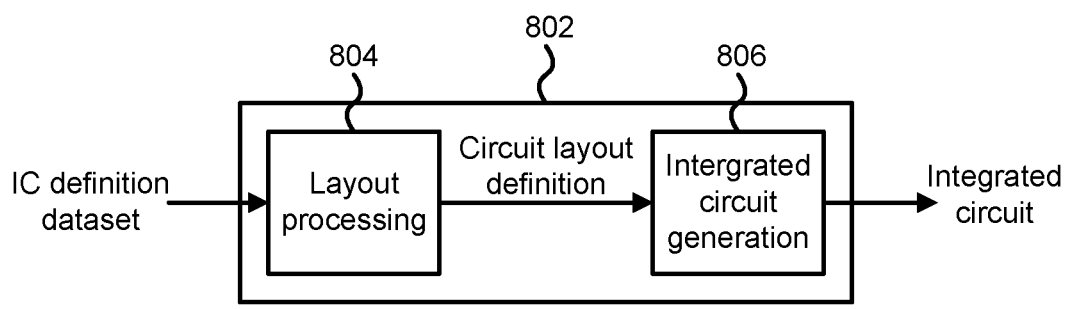
FIG. 8 shows an integrated circuit manufacturing system.

FIG. 8 shows an example of an integrated circuit (IC) manufacturing system 802 which is configured to manufacture error detection circuits 300 and 600 as described in any of the examples herein. In particular, the IC manufacturing system 802 comprises a layout processing system 804 and an integrated circuit generation system 806. The IC manufacturing system 802 is configured to receive an IC definition dataset (e.g. defining a error detection circuits 300 and 600 as described in any of the examples herein), process the IC definition dataset, and generate an IC according to the IC definition dataset (e.g. which embodies error detection circuits 300 and 600 as described in any of the examples herein). The processing of the IC definition dataset configures the IC manufacturing system 1002 to manufacture an integrated circuit embodying error detection circuits 300 and 600 as described in any of the examples herein.

The layout processing system 804 is configured to receive and process the IC definition dataset to determine a circuit layout. Methods of determining a circuit layout from an IC definition dataset are known in the art, and for example may involve synthesising RTL code to determine a gate level representation of a circuit to be generated, e.g. in terms of logical components (e.g. NAND, NOR, AND, OR, MUX and FLIP-FLOP components). A circuit layout can be determined from the gate level representation of the circuit by determining positional information for the logical components. This may be done automatically or with user involvement in order to optimise the circuit layout. When the layout processing system 804 has determined the circuit layout it may output a circuit layout definition to the IC generation system 806. A circuit layout definition may be, for example, a circuit layout description.

The IC generation system 806 generates an IC according to the circuit layout definition, as is known in the art. For example, the IC generation system 806 may implement a semiconductor device fabrication process to generate the IC, which may involve a multiple-step sequence of photo lithographic and chemical processing steps during which electronic circuits are gradually created on a wafer made of semiconducting material. The circuit layout definition may be in the form of a mask which can be used in a lithographic process for generating an IC according to the circuit definition. Alternatively, the circuit layout definition provided to the IC generation system 806 may be in the form of computer-readable code which the IC generation system 806 can use to form a suitable mask for use in generating an IC.

The different processes performed by the IC manufacturing system 802 may be implemented all in one location, e.g. by one party. Alternatively, the IC manufacturing system 802 may be a distributed system such that some of the processes may be performed at different locations, and may be performed by different parties. For example, some of the stages of: (i) synthesising RTL code representing the IC definition dataset to form a gate level representation of a circuit to be generated, (ii) generating a circuit layout based on the gate level representation, (iii) forming a mask in accordance with the circuit layout, and (iv) fabricating an integrated circuit using the mask, may be performed in different locations and/or by different parties.

In other examples, processing of the integrated circuit definition dataset at an integrated circuit manufacturing system may configure the system to manufacture error detection circuits 300 and 600 without the IC definition dataset being processed so as to determine a circuit layout. For instance, an integrated circuit definition dataset may define the configuration of a reconfigurable processor, such as an FPGA, and the processing of that dataset may configure an IC manufacturing system to generate a reconfigurable processor having that defined configuration (e.g. by loading configuration data to the FPGA).

In some embodiments, an integrated circuit manufacturing definition dataset, when processed in an integrated circuit manufacturing system, may cause an integrated circuit manufacturing system to generate a device as described herein. For example, the configuration of an integrated circuit manufacturing system in the manner described above with respect to FIG. 8 by an integrated circuit manufacturing definition dataset may cause a device as described herein to be manufactured.

In some examples, an integrated circuit definition dataset could include software which runs on hardware defined at the dataset or in combination with hardware defined at the dataset. In the example shown in FIG. 8, the IC generation system may further be configured by an integrated circuit definition dataset to, on manufacturing an integrated circuit, load firmware onto that integrated circuit in accordance with program code defined at the integrated circuit definition dataset or otherwise provide program code with the integrated circuit for use with the integrated circuit.

The implementation of concepts set forth in this application in devices, apparatus, modules, and/or systems (as well as in methods implemented herein) may give rise to performance improvements when compared with known implementations. The performance improvements may include one or more of increased computational performance, reduced latency, increased throughput, and/or reduced power consumption. During manufacture of such devices, apparatus, modules, and systems (e.g. in integrated circuits) performance improvements can be traded-off against the physical implementation, thereby improving the method of manufacture. For example, a performance improvement may be traded against layout area, thereby matching the performance of a known implementation but using less silicon. This may be done, for example, by reusing functional blocks in a serialised fashion or sharing functional blocks between elements of the devices, apparatus, modules and/or systems. Conversely, concepts set forth in this application that give rise to improvements in the physical implementation of the devices, apparatus, modules, and systems (such as reduced silicon area) may be traded for improved performance. This may be done, for example, by manufacturing multiple instances of a module within a predefined area budget.

The applicant hereby discloses in isolation each individual feature described herein and any combination of two or more such features, to the extent that such features or combinations are capable of being carried out based on the present specification as a whole in the light of the common general knowledge of a person skilled in the art, irrespective of whether such features or combinations of features solve any problems disclosed herein. In view of the foregoing description it will be evident to a person skilled in the art that various modifications may be made within the scope of the invention.

What is claimed is:

1. An error detection circuit for performing a cyclic redundancy check on a clock gated register signal, the error detection circuit comprising:
   a first register;
   a second register;
   a third register;
   a check bit calculation unit; and
   an error detection module;
   wherein the first register and the check bit calculation unit are configured to receive the same data signal (x);
   wherein the first register is a clock gated register configured to be updated with the data signal (x) in response to a clock enabling signal;
   wherein the check bit calculation unit is configured to calculate a check bit (c) based on the received data signal (x);
   wherein the second register is configured to be updated with the check bit (c) calculated by the check bit calculation unit;
   wherein the third register is configured to be updated with a current value (b) of the clock enabling signal; and
   wherein the error detection module is configured to receive, as inputs, an output of the first register, an output of the second register and an output of the third register, and is further configured to calculate an indication bit (I) based on those inputs.

2. The error detection circuit according to claim 1, wherein the check bit calculation unit is configured to calculate the check bit by performing XOR reduction operation or nXOR reduction operation of the n bits of the data signal (x).

3. The error detection circuit according to claim 1, wherein the check bit calculation unit is configured to calculate the check bit by nXOR reducing or XNOR reducing the n bits of the data signal (x).

4. The error detection circuit according to claim 1, wherein the check bit is an even parity bit or an odd parity bit.

5. The error detection circuit according to claim 1, wherein the first register is configured to be updated with a data signal (x) every time when the first register is enabled in response to the clock enabling signal.

6. The error detection circuit according to claim 1, wherein the second register is configured to be updated with a check bit (c) irrespective of the clock enabling signal.

7. The error detection circuit according to claim 1, wherein the third register is not a clock gated register and is configured to be updated with a 1 bit when the clock enabling signal is high and with a 0 bit when the clock enabling signal is low.

8. The error detection circuit according to claim 1, wherein the error detection module is configured to detect an error in updating the first register based on a valid signal stored in a fourth register.

9. The error detection circuit according to claim 1, wherein the error detection module is configured to detect an error in updating the first register when the indication bit (I) is a high value.

10. The error detection circuit according to claim 1, wherein third register is configured to store the value of the current clock signal and to provide the output to the error detection circuit thereby eliminating consecutive false positive failures.

11. A method of performing a cyclic redundancy check on a clock gated register signal, the method comprising:
providing the same data signal (x) to a first register and a check bit calculation unit;
updating the first register with a data signal (x) in response to a clock enabling signal;
calculating, at the check bit calculation unit, a check bit (c) based on the received data signal (x);
updating a second register with the check bit (c) calculated by the check bit calculation unit;
updating a third register with a current value (b) of the clock enabling signal; and
receiving at an error detection module, as inputs, an output of the first register, an output of the second register and an output of the third register, and calculating an indication bit (I) based on those inputs.

12. The method according to claim 11, wherein updating the second register comprises updating with the calculated check bit irrespective of whether the clock enabling signal is a high or a low.

13. The method according to claim 11, wherein the updating the third register is performed irrespective of whether the clock enabling signal is a high or a low.

14. The method according to claim 13, wherein calculation of the indication bit (I) comprises performing calculation based on a valid signal stored in a fourth register.

15. The method according to claim 11, wherein the calculation of the indication bit (I) comprises producing a value only when the output of the third register indicates that the first register and the second register is updated.

16. The method according to claim 11, wherein calculating the indication bit based on the current value of clock enabling signal eliminates consecutive false positive failures in consecutive clock cycles.

17. A method of manufacturing, using an integrated circuit manufacturing system, an error detection circuit as set forth in claim 1, the method comprising:
processing, using a layout processing system, a computer readable description of the error detection circuit so as to generate a circuit layout description of an integrated circuit embodying the error detection circuit; and
manufacturing, using an integrated circuit generation system, the error detection circuit according to the circuit layout description.

18. A non-transitory computer readable storage medium having stored thereon computer readable code configured to cause the method as set forth in claim 11 to be performed when the code is run on at least one processor.

19. A non-transitory computer readable storage medium having stored thereon an integrated circuit definition dataset that, when processed in an integrated circuit manufacturing system, configures the integrated circuit manufacturing system to manufacture an error detection circuit as set forth in claim 1.

20. A non-transitory computer readable storage medium having stored thereon a computer readable dataset description of an error detection circuit as set forth in claim 1 that, when processed in an integrated circuit manufacturing system, causes the integrated circuit manufacturing system to manufacture an integrated circuit embodying a graphics processing system including the error detection circuit.

* * * * *